United States Patent
Shibuya et al.

(10) Patent No.: US 6,871,053 B2
(45) Date of Patent: Mar. 22, 2005

(54) WIRELESS COMMUNICATION APPARATUS

(75) Inventors: Yasuhiro Shibuya, Sendai (JP); Koji Hirai, Sendai (JP); Hiroyuki Kiyanagi, Sendai (JP)

(73) Assignee: Fujitsu Limited, Kawasaki (JP)

( * ) Notice: Subject to any disclaimer, the term of this patent is extended or adjusted under 35 U.S.C. 154(b) by 462 days.

(21) Appl. No.: 09/768,679

(22) Filed: Jan. 24, 2001

(65) Prior Publication Data

US 2002/0016158 A1 Feb. 7, 2002

(30) Foreign Application Priority Data

Jul. 3, 2000 (JP) ........................................ 2000-200962

(51) Int. Cl.$^7$ ................................................ H04B 1/06
(52) U.S. Cl. .................. 455/232.1; 455/103; 455/127.2
(58) Field of Search .......................... 455/103, 91, 129, 455/12.1, 13.1, 126, 127.2, 115.1, 232.1; 370/339, 297, 310

(56) References Cited

U.S. PATENT DOCUMENTS

| | | | | |
|---|---|---|---|---|
| 4,890,110 A | * | 12/1989 | Kuwahara | 342/35 |
| 5,530,920 A | * | 6/1996 | Takeda | 455/102 |
| 5,754,949 A | * | 5/1998 | Kumagai et al. | 455/115.1 |
| 5,790,555 A | * | 8/1998 | Narahashi et al. | 370/480 |
| 5,809,420 A | * | 9/1998 | Ichiyanagi et al. | 455/103 |
| 6,185,201 B1 | | 2/2001 | Kiyanagi et al. | |
| 6,346,910 B1 | * | 2/2002 | Ito | 342/174 |
| 6,434,360 B1 | * | 8/2002 | Yagawa | 455/3.02 |

FOREIGN PATENT DOCUMENTS

| | | |
|---|---|---|
| JP | 53-52011 | 5/1978 |
| JP | 58-200640 | 11/1983 |
| JP | 2098338 | 4/1990 |
| JP | 4-291832 | 10/1992 |
| JP | 05-145459 | 6/1993 |
| JP | 6-326640 | 11/1994 |
| JP | 09-064780 | 3/1997 |
| JP | 10-126836 | 5/1998 |
| JP | 11-275033 | 10/1999 |

\* cited by examiner

*Primary Examiner*—Sonny Trinh
(74) *Attorney, Agent, or Firm*—Katten Muchin Zavis Rosenman

(57) ABSTRACT

A wireless communication apparatus according to the present invention is composed of a first section for carrying out wireless communication with a multichannel signal and a second section having a plurality of channel units each process a predetermined frequency signal as a channel signal. The wireless communication apparatus is arranged to have a plurality of variable attenuators each provided for corresponding one of the channel signals received from each channel unit of the second section, a combiner for combining outputs from the respective variable attenuators together and outputting the resultant combined signal to the first section, and a control unit for controlling the degree of attenuation of the individual variable attenuators according to the variation of the number of the channel signals. According to the arrangement, the wireless communication apparatus can not only communicate with an opponent station by transmitting a multichannel signal but also effectively suppress negative influence on existing channel even if a new channel unit is additionally provided.

20 Claims, 23 Drawing Sheets

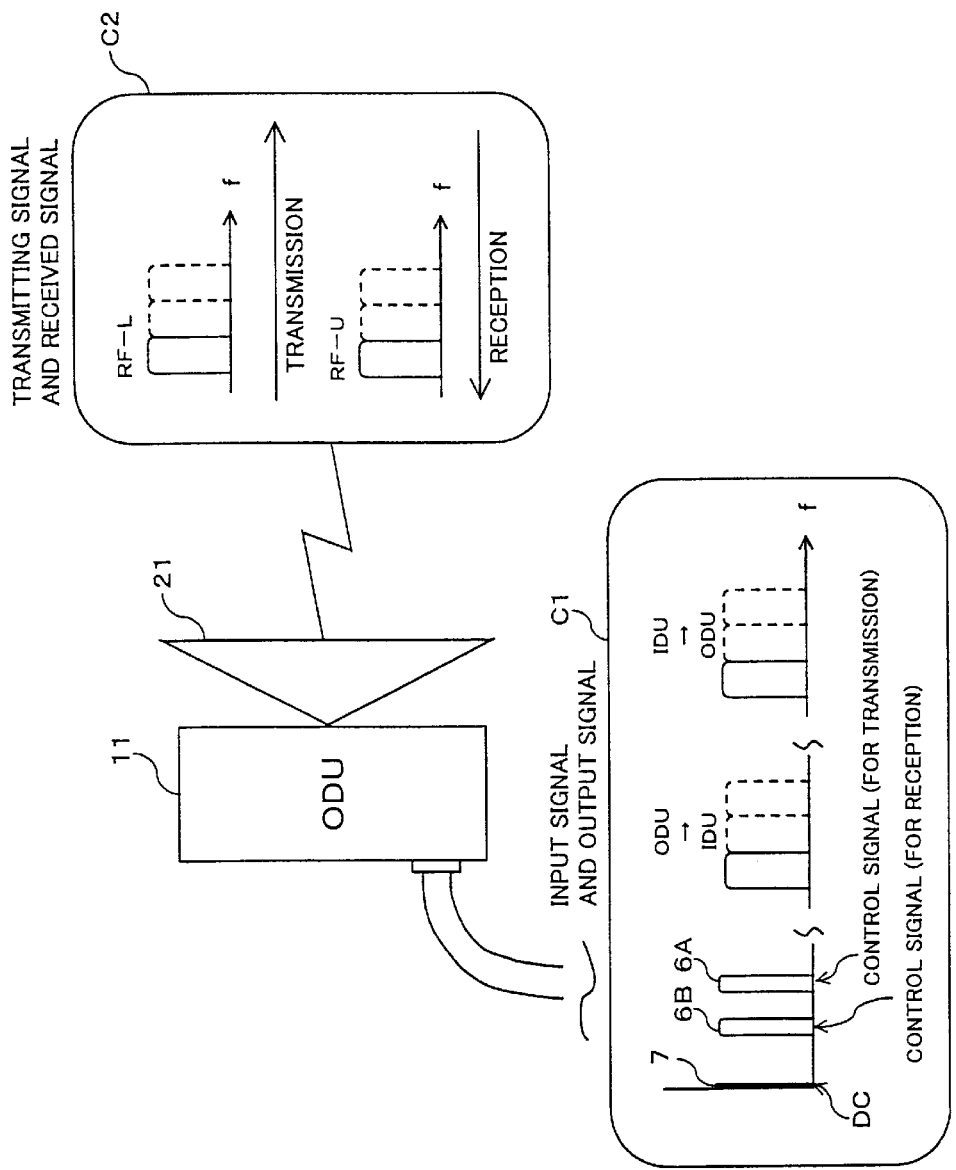

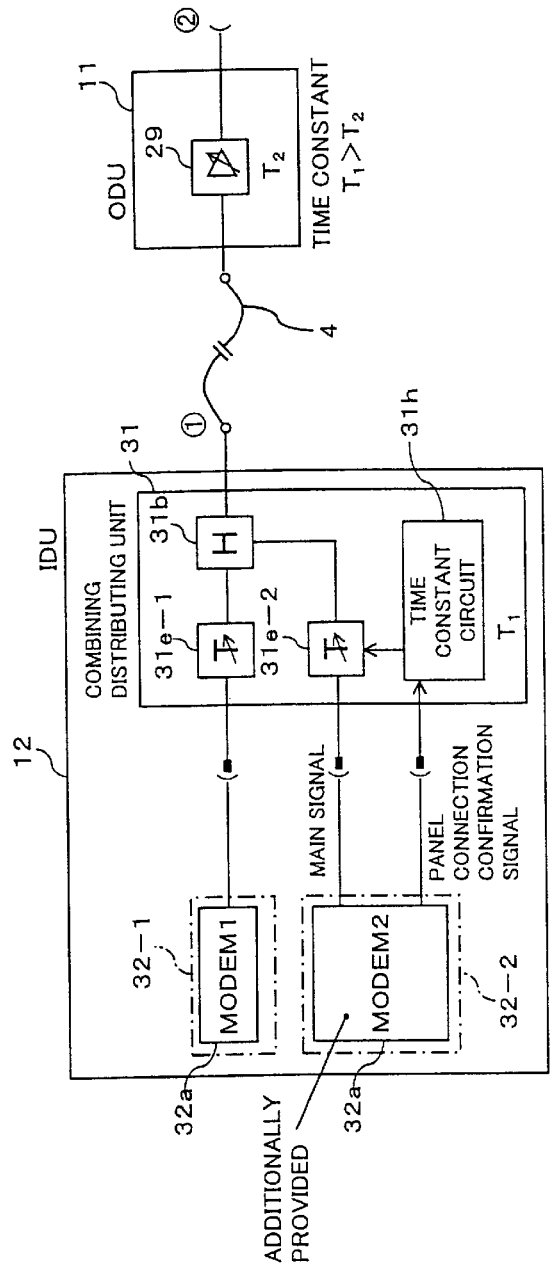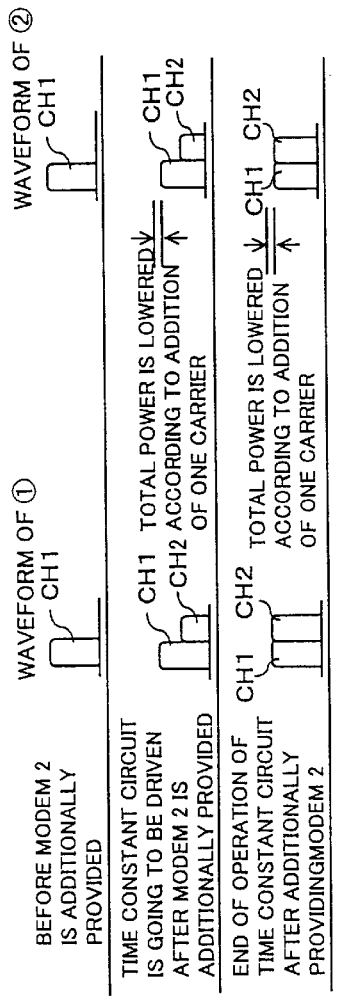

TOTAL TRANSMITTING POWER IS SET TO CONSTANT REGARDLESS OF NUMBER OF CHANNELS

OFFSET V ⇒ TOTAL TRANSMITTING POWER IS CONSTANT REGARDLESS OF NUMBER OF CARRIERS

TRANSMITTING POWER PER SINGLE CARRIER IS MADE CONSTANT

OFFSET V ⇒ TOTAL TRANSMITTING POWER BECOMES VARIABLE DEPENDING ON NUMBER OF CARRIERS

FIG. 15(A)
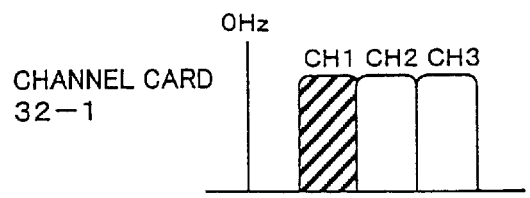
FIG. 15(B)
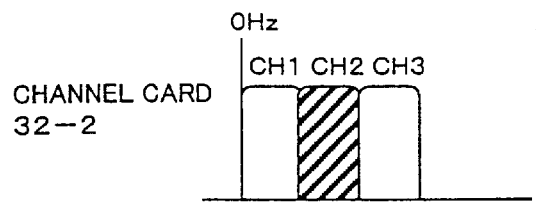
FIG. 15(C)  FIG. 15(D)
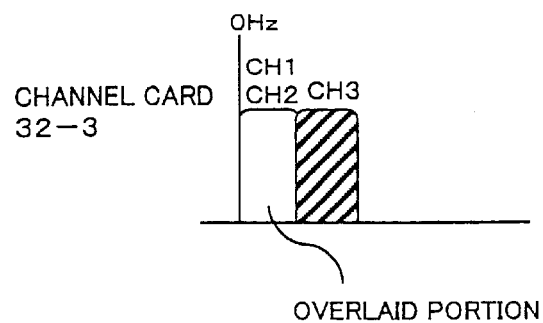 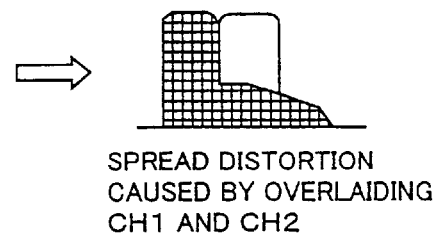
SPREAD DISTORTION
CAUSED BY OVERLAIDING
CH1 AND CH2
FIG. 15(E)
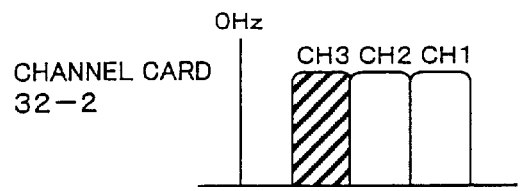

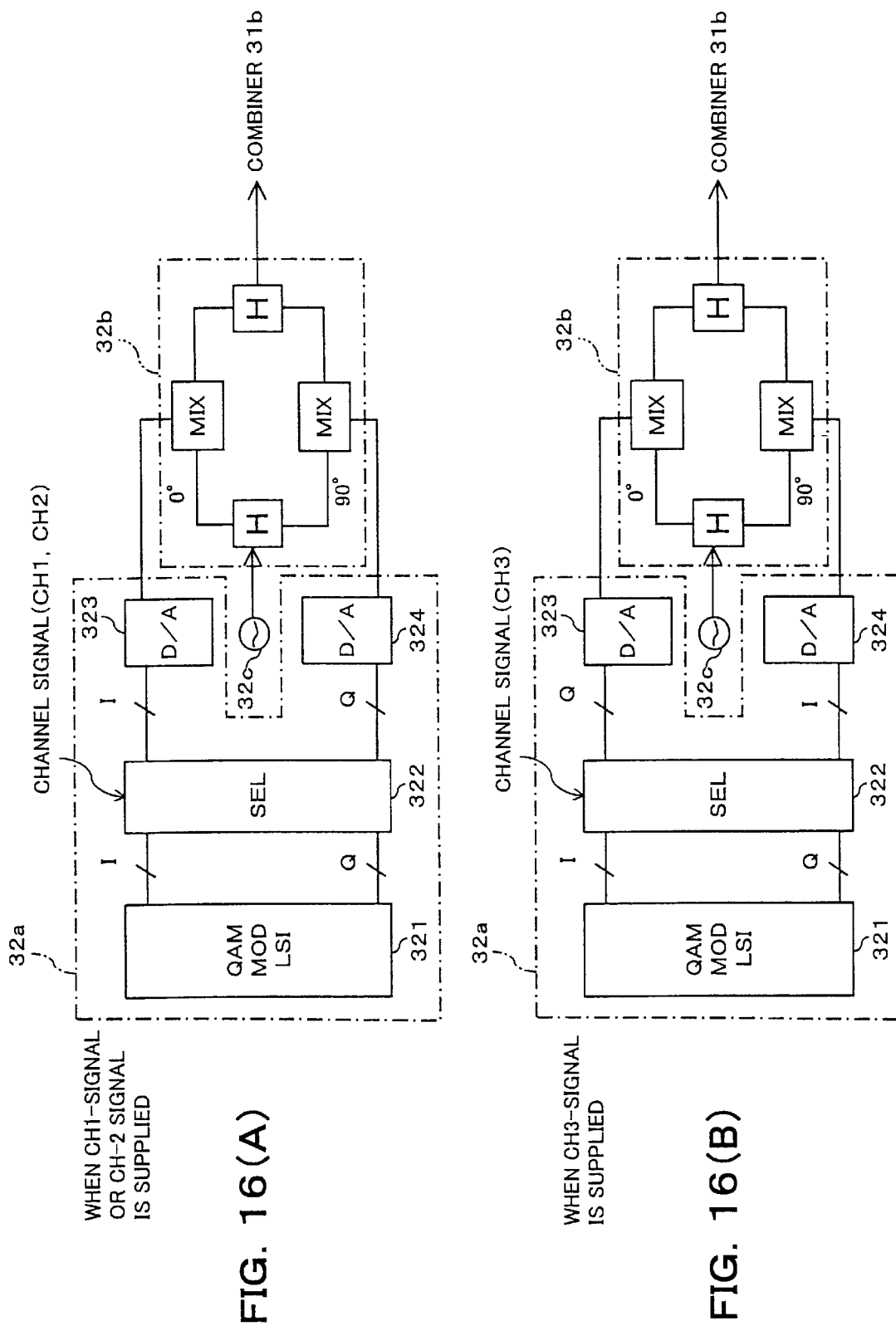

| | TX channel | | | | | | RX channel | | | | | |
|---|---|---|---|---|---|---|---|---|---|---|---|---|
| | 4×2M | | 8×2M | | 16×2M | | 4×2M | | 8×2M | | 16×2M | |
| CH NO. | FREQUENCY(MHz) | CH NO. | FREQUENCY(MHz) | CH NO. | FREQUENCY(MHz) | CH NO. | FREQUENCY(MHz) | CH NO. | FREQUENCY(MHz) | CH NO. | FREQUENCY(MHz) |
| 1 | 17724 | 1 | 17713.75 | 1 | 17727.5 | 1 | 18732 | 1 | 18723.75 | 1 | 18737.5 |
| 2 | 17731 | 2 | 17727.5 | 2 | 17755 | 2 | 18739 | 2 | 18737.5 | 2 | 18765 |
| 3 | 17738 | 3 | 17741.25 | 3 | 17782.5 | 3 | 18746 | 3 | 18751.25 | 3 | 18792.5 |
| 4 | 17745 | 4 | 17755 | 4 | 17810 | 4 | 18753 | 4 | 18765 | 4 | 18820 |
| 5 | 17752 | 5 | 17768.75 | 5 | 17837.5 | 5 | 18760 | 5 | 18778.75 | 5 | 18847.5 |
| 6 | 17759 | 6 | 17782.5 | 6 | 17865 | 6 | 18767 | 6 | 18792.5 | 6 | 18875 |
| 7 | 17766 | 7 | 17796.25 | 7 | 17892.5 | 7 | 18774 | 7 | 18806.25 | 7 | 18902.5 |
| 8 | 17773 | 8 | 17810 | 8 | 17920 | 8 | 18781 | 8 | 18820 | 8 | 18930 |
| 9 | 17780 | 9 | 17823.75 | 9 | 17947.5 | 9 | 18788 | 9 | 18833.75 | 9 | 18957.5 |
| 10 | 17787 | 10 | 17837.5 | — | — | 10 | 18795 | 10 | 18847.5 | — | — |
| 11 | 17794 | 11 | 17851.25 | — | — | 11 | 18802 | 11 | 18861.25 | — | — |
| 12 | 17801 | 12 | 17865 | — | — | 12 | 18809 | 12 | 18875 | — | — |
| 13 | 17808 | 13 | 17878.75 | — | — | 13 | 18816 | 13 | 18888.75 | — | — |
| 14 | 17815 | 14 | 17892.5 | — | — | 14 | 18823 | 14 | 18902.5 | — | — |
| 15 | 17822 | 15 | 17906.25 | — | — | 15 | 18830 | 15 | 18916.25 | — | — |
| 16 | 17829 | 16 | 17920 | — | — | 16 | 18837 | 16 | 18930 | — | — |
| 17 | 17836 | 17 | 17933.75 | — | — | 17 | 18844 | 17 | 18943.75 | — | — |
| 18 | 17843 | 18 | 17947.5 | — | — | 18 | 18851 | 18 | 18957.5 | — | — |
| 19 | 17850 | — | — | — | — | 19 | 18858 | — | — | — | — |
| 20 | 17857 | — | — | — | — | 20 | 18865 | — | — | — | — |
| 21 | 17864 | — | — | — | — | 21 | 18872 | — | — | — | — |
| 22 | 17871 | — | — | — | — | 22 | 18879 | — | — | — | — |
| 23 | 17878 | — | — | — | — | 23 | 18886 | — | — | — | — |
| 24 | 17885 | — | — | — | — | 24 | 18893 | — | — | — | — |
| 25 | 17892 | — | — | — | — | 25 | 18900 | — | — | — | — |
| 26 | 17899 | — | — | — | — | 26 | 18907 | — | — | — | — |
| 27 | 17906 | — | — | — | — | 27 | 18914 | — | — | — | — |
| 28 | 17913 | — | — | — | — | 28 | 18921 | — | — | — | — |
| 29 | 17920 | — | — | — | — | 29 | 18928 | — | — | — | — |
| 30 | 17927 | — | — | — | — | 30 | 18935 | — | — | — | — |
| 31 | 17934 | — | — | — | — | 31 | 18942 | — | — | — | — |
| 32 | 17941 | — | — | — | — | 32 | 18949 | — | — | — | — |
| 33 | 17948 | — | — | — | — | 33 | 18956 | — | — | — | — |
| 34 | 17955 | — | — | — | — | 34 | 18963 | — | — | — | — |

| | TX channel | | | | | | RX channel | | | | | |
|---|---|---|---|---|---|---|---|---|---|---|---|---|
| 4×2M | | 8×2M | | 16×2M | | 4×2M | | 8×2M | | 16×2M | | |
| CH NO. | FREQUENCY(MHz) | CH NO. | FREQUENCY(MHz) | CH NO. | FREQUENCY(MHz) | CH NO. | FREQUENCY(MHz) | CH NO. | FREQUENCY(MHz) | CH NO. | FREQUENCY(MHz) | |
| 1 | 18732 | 1 | 18723.75 | 1 | 18737.5 | 1 | 17724 | 1 | 17713.75 | 1 | 17727.5 |
| 2 | 18739 | 2 | 18737.5 | 2 | 18765 | 2 | 17731 | 2 | 17727.5 | 2 | 17755 |
| 3 | 18746 | 3 | 18751.25 | 3 | 18792.5 | 3 | 17738 | 3 | 17741.25 | 3 | 17782.5 |
| 4 | 18753 | 4 | 18765 | 4 | 18820 | 4 | 17745 | 4 | 17755 | 4 | 17810 |
| 5 | 18760 | 5 | 18778.75 | 5 | 18847.5 | 5 | 17752 | 5 | 17768.75 | 5 | 17837.5 |
| 6 | 18767 | 6 | 18792.5 | 6 | 18875 | 6 | 17759 | 6 | 17782.5 | 6 | 17865 |
| 7 | 18774 | 7 | 18806.25 | 7 | 18902.5 | 7 | 17766 | 7 | 17796.25 | 7 | 17892.5 |
| 8 | 18781 | 8 | 18820 | 8 | 18930 | 8 | 17773 | 8 | 17810 | 8 | 17920 |
| 9 | 18788 | 9 | 18833.75 | 9 | 18957.5 | 9 | 17780 | 9 | 17823.75 | 9 | 17947.5 |
| 10 | 18795 | 10 | 18847.5 | – | – | 10 | 17787 | 10 | 17837.5 | – | – |
| 11 | 18802 | 11 | 18861.25 | – | – | 11 | 17794 | 11 | 17851.25 | – | – |
| 12 | 18809 | 12 | 18875 | – | – | 12 | 17801 | 12 | 17865 | – | – |
| 13 | 18816 | 13 | 18888.75 | – | – | 13 | 17808 | 13 | 17878.75 | – | – |
| 14 | 18823 | 14 | 18902.5 | – | – | 14 | 17815 | 14 | 17892.5 | – | – |
| 15 | 18830 | 15 | 18916.25 | – | – | 15 | 17822 | 15 | 17906.25 | – | – |
| 16 | 18837 | 16 | 18930 | – | – | 16 | 17829 | 16 | 17920 | – | – |
| 17 | 18844 | 17 | 18943.75 | – | – | 17 | 17836 | 17 | 17933.75 | – | – |
| 18 | 18851 | 18 | 18957.5 | – | – | 18 | 17843 | 18 | 17947.5 | – | – |
| 19 | 18858 | – | – | – | – | 19 | 17850 | – | – | – | – |
| 20 | 18865 | – | – | – | – | 20 | 17857 | – | – | – | – |
| 21 | 18872 | – | – | – | – | 21 | 17864 | – | – | – | – |
| 22 | 18879 | – | – | – | – | 22 | 17871 | – | – | – | – |
| 23 | 18886 | – | – | – | – | 23 | 17878 | – | – | – | – |
| 24 | 18893 | – | – | – | – | 24 | 17885 | – | – | – | – |
| 25 | 18900 | – | – | – | – | 25 | 17892 | – | – | – | – |
| 26 | 18907 | – | – | – | – | 26 | 17899 | – | – | – | – |
| 27 | 18914 | – | – | – | – | 27 | 17906 | – | – | – | – |
| 28 | 18921 | – | – | – | – | 28 | 17913 | – | – | – | – |
| 29 | 18928 | – | – | – | – | 29 | 17920 | – | – | – | – |
| 30 | 18935 | – | – | – | – | 30 | 17927 | – | – | – | – |
| 31 | 18942 | – | – | – | – | 31 | 17934 | – | – | – | – |
| 32 | 18949 | – | – | – | – | 32 | 17941 | – | – | – | – |
| 33 | 18956 | – | – | – | – | 33 | 17948 | – | – | – | – |
| 34 | 18963 | – | – | – | – | 34 | 17955 | – | – | – | – |

WIRELESS COMMUNICATION APPARATUS

BACKGROUND OF THE INVENTION

(1) Field of the Invention

The present invention relates to a wireless communication apparatus, and more particularly to a wireless communication apparatus including an indoor unit and an outdoor unit for use in a wireless communication of a millimeter frequency band or a quasi-millimeter frequency band.

(2) Description of Related Art

FIG. 23 is a diagram showing in a block form one example of a conventional wireless communication apparatus for use in a millimeter frequency band or a quasi-millimeter frequency band. As shown in FIG. 23, a wireless communication system 100 is arranged to include buildings of local stations 200, 300 such as a telephone switching center located in an opposing fashion. Each of the local stations 200 and 300 is arranged to include an indoor unit (hereinafter referred to as IDU) 201, 301 provided within the building and an outdoor unit (hereinafter referred to as ODU) 202, 302 provided on a steel tower 203, 303 near the building of the local station 200, 300.

In the following description, a set of IDU and ODU is referred to as a millimeter wireless communication apparatus or simply referred to as a wireless communication apparatus. Further, the term "millimeter" or "quasi-millimeter" means a frequency band of a radio wave at about 13 GHz to 38 GHz.

In this case, the above-introduced IDU 201 (301) up-converts a transmitting baseband signal into an intermediate frequency band signal (IF signal) and transmits the IF signal to the ODU 202 (302) with a cable communication so as to transmit to the opposing station 300 (200). Also, the IDU 201 (301) has a function for down-converting an IF signal received from the ODU 202 (302) to obtain a baseband signal. The ODU 202 (302) also up-converts the IF signal received from the IDU 201 (301) into an RF (radio frequency band) signal of a millimeter wave (or quasi-millimeter wave) band (a frequency of 13 GHz or more) and transmits the RF signal to the opposing station 300 (200) with a wireless communication. Also, the ODU 202 (302) has a function to receive an RF signal transmitted from the opposing station 300 (200) and down-convert the received RF signal into an IF signal to transmit to the IDU 201 (301).

In the above-described conventional wireless communication system 100, a cable communication using an IF signal is effected between the IDU 201 (301), and the ODU 202 (302) and a wireless communication using an RF signal is effected between the ODUs 202 and 302 opposing to each other.

However, the above-introduced wireless communication system 100 using millimeter wave (or quasi-millimeter wave) tends to suffer from loss between feeders or rain attenuation due to the property of an electromagnetic wave of the millimeter wave (or quasi-millimeter wave). Thus, such wireless communication system has not been suitable for a long-distance transmission and not been widely deployed very much.

However, owing to the recent explosive deployment of the internet, an access channel wireless system such as a mobile communication unit is developed rapidly and the number of carrier waves allowable to be accommodated within the C-band for long-distance transmission comes to the limit. For this reason, there can be observed a rapid increase of demand in a wireless communication in a millimeter wave or quasi-millimeter wave.

For example, in a communication network using mobile communication units, the distance between radio base stations is relatively short and hence signal transmission can be positively carried out by using a wireless transmission system using the millimeter wave. Thus, it can be considered that a millimeter wave is utilized for communication between the radio base stations. Further, the utilization of millimeter wave is not limited to the above application but, for example, it is considered that firms located with a relatively short distance between them are connected by an exclusively utilized network using a millimeter wave. Furthermore, as shown in FIG. 24, it is considered that a number of millimeter wireless communication apparatus 400 are connected in a multi-hop fashion so as to realize a long-distance transmission substantially equivalent to the transmission distance at the C-band (about 50 to 100 Km).

However, according to the conventional millimeter wireless communication apparatus, a possible transmission distance is limited by a single wave that is assigned to a single unit of ODU. Therefore, if the transmission capacity is to be increased, the possible transmission distance has to be shortened. Alternatively, as shown in FIG. 25, a whole communication system including the IDUs and ODUs shall be additionally provided.

For this reason, if the communication network using the millimeter wave is additionally provided with the above-illustrated multi-hop connection channel, each of the base stations shall be additionally provided with the IDU (channel unit) and the ODU, which fact leads to serious disadvantage in terms of cost of facility. Particularly, since parts for constructing the ODU for millimeter wave communication are very expensive, it becomes a heavy burden to additionally provide an ODU from a cost standpoint. Further, the whole communication network cannot cope with the additional installation of a system or increase and/or decrease of carrier wave number with flexibility. Thus, the network can always service only a fixed amount of transmission capacity to every end user.

In order to solve the above problem, it can be considered that a plurality of IDUs are made connectable to a single unit of ODU through a combiner-distributor so that the communication network can cope with the additional installation of carrier (channel) with flexibility. However, in this case, the transmission distance shall be made short so that a single unit of ODU can transmit a multichannel signal employing a plurality of millimeter waves as carrier waves without no trouble.

However, if the wireless communication apparatus is simply arranged such that signals (IF signals) received from a plurality of IDUs are combined and fed to the ODU, when an IDU is additionally provided for a single wave, a transmitting power is abruptly increased, with the result that a negative influence is caused on channels in service. Further, if the signals received from the plurality of IDUs are combined and the resultant combined signal is received as a multichannel signal as described above, the apparatus on the receiving side needs to separate (extract) each channel signal from the received multichannel signal using a filter or the like which corresponds to the frequency of the channel signal and transmit the extracted channel signal to the corresponding IDU. However, if the receiving process includes the filter process for separating the channel signal, the frequency (channel frequency) which each IDU can process comes to be fixed.

The above fact is extremely disadvantageous when each IDU is shared for processing a plurality of channel signals. In particular, according to the recommendation of the ITU-R (International Telecommunication Union-Radio Communication sector), the channel interface of a millimeter wireless communication apparatus is provided with three kinds of modes, or 2 MHz×4, 2 MHz×8, 2 MHz×16, and a band for one wave differs for each mode. Thus, if the channel frequency which each IDU can process comes to be fixed, the communication apparatus shall be provided with an IDU for each fixed frequency for each mode.

SUMMARY OF THE INVENTION

The present invention is made in view of the above object. Therefore, an object of the present invention is to provide a wireless communication apparatus in which negative influence on an existing channel in service can be suppressed upon additionally providing a channel, and the channel frequency processed by the IDU can be free from fixation and hence the IDU (channel unit) can be shared for processing a plurality of channel signals.

In order to attain the above object, there is provided a wireless communication apparatus composed of a first section for carrying out wireless communication with a multichannel signal and a second section having a plurality of channel units each processing a predetermined frequency signal as a channel signal, the wireless communication apparatus including a plurality of variable attenuators each provided for corresponding one of the channel signals received from each channel unit of the second section, a combiner for combining outputs from the respective variable attenuators together and outputting the resultant combined signal to the first section, and a control unit for controlling the degree of attenuation of the individual variable attenuators according to the variation of the number of the channel signals.

According to the wireless communication apparatus of the present invention arranged as described above, the degree of attenuation of the individual variable attenuators is controlled according to the change of the number of the channel signals deriving from increase of channel number or the like. Therefore, the power of the individual channel signals before the combining can be independently and gradually controlled.

Accordingly, the multichannel signal to be transmitted can be surely prevented from abrupt increase in transmitting power, and hence the existing channel in service can be free from negative influence caused by the abrupt increase in the transmitting power. Alternatively, the wireless communication apparatus can be surely prevented from a state in which the apparatus is driven at an excessive transmission power.

According to the present invention, there is provided a wireless communication apparatus composed of a first section for carrying out wireless communication with a multichannel signal and a second section having a plurality of channel units each processing a predetermined frequency signal as a channel signal, the wireless communication apparatus including a distributor for distributing the multichannel signal received from the first section to respective channel units, and a frequency setting unit for setting a operating frequency of a channel unit according to a frequency of the channel signal, which is to be processed in the corresponding channel unit, constituting the multichannel signal distributed to respective channel units by the distributor, wherein each of the channel units is provided with a frequency-variable type frequency converting circuit for subjecting the multichannel signal to frequency-conversion with a desired local oscillator frequency so as to obtain the channel signal, and the frequency setting unit is arranged to set the local oscillator frequency by the operating frequency so that frequency arrangement of the channel signals obtained from the frequency-conversion contains no overlap within the band of the multichannel signal.

According to the wireless communication apparatus of the present invention arranged as described above, although each of the channel units receive the same multichannel signal owing to the above distributor, each of the channel unit is made to have set the operating frequency, by the frequency setting unit, for processing the channel signal which is to be processed by the channel unit. Therefore, although each of the channel unit has the same arrangement, the channel unit can process a channel signal of any frequency depending on the setting of the frequency. Moreover, it becomes possible to avoid an overlap of the plurality of channel frequencies by the above-described frequency conversion. Therefore, the process of frequency conversion will not negatively influence on another channel.

Therefore, the following advantage can be obtained.

① Even if all of the channel units have the same construction, each channel unit can process its own channel signal different from one another depending on the setting. In other words, the each operating frequency for the channel signal in the individual channel units is not fixed. As a result, the individual channel units can be common to a plurality of channel frequencies.

② It becomes possible to avoid an overlap of the channel frequencies adjacent to each other. Therefore, a phenomenon of negative influence on another channel can be avoided and a desired channel signal can be correctly demodulated.

In more concretely, for example, the frequency setting unit is arranged to set a local oscillator frequency to a channel unit for the highest frequency band side signal of the multichannel signal so that the local oscillator frequency is distant from the central frequency to the higher frequency side by a distance which is equal to the distance from the central frequency to a local oscillator frequency of a channel unit for the lowest frequency band side signal of the multichannel signal.

If the frequency assignment is arranged as described above, the channel frequency distribution of the multichannel signal after the frequency conversion is arranged in the reverse order in the case of that the frequency conversion is not performed. Therefore, it becomes possible to positively avoid an overlap of the plurality of channel frequencies when the frequency conversion is effected.

The present wireless communication apparatus may be arranged such that one or more of the plurality of channel units are arranged to process the same channel signal, and a selecting unit for selecting one of outputs from the channel units is additionally provided. If the present wireless communication apparatus is arranged as above, the channel units each processing the same channel signal can be utilized for work use and protection use, respectively. Thus, the redundancy of the channel units is realized.

Therefore, it becomes possible to expect great contribution to the improvement in reliability of the wireless communication apparatus and improvement in flexibility upon constructing a communication system.

Other objects and further features of the present invention will be apparent from the following detailed description when read in conjunction with the accompanying drawings.

BRIEF DESCRIPTION OF THE DRAWINGS

FIG. 6 is a diagram illustrative of how a signal is inputted to and outputted from the ODU shown in FIG. 1 and how a signal is transmitted from and received by the same ODU;

FIG. 7(A) is a block diagram showing an arrangement of the main portion of the wireless communication apparatus of the millimeter wave shown in FIG. 1 when a new channel unit is additionally provided;

FIGS. 7(B) to 7(E) are diagrams each showing one example of an output waveform of the IDU and ODU when the new channel unit is additionally provided;

FIGS. 15(A) to 15(E) are diagrams each schematically showing an example of arrangement of channel frequencies corresponding to the local oscillator frequencies according to the present embodiment;

FIGS. 16(A) and 16(B) are block diagrams showing the arrangement (upon exchanging I-channel and Q-channel with each other) of a modulating unit shown in FIGS. 1 and 2;

FIG. 21 is a diagram showing in a table form an example of channel frequency arrangement (18G-L) according to the recommendation of ITU-R;

FIG. 22 is a diagram showing in a table form an example of channel frequency arrangement (18G-U) according to the recommendation of ITU-R;

DESCRIPTION OF THE PREFERRED EMBODIMENTS

Embodiments of the present invention will hereinafter be described with reference to drawings.

(A) Description of a First Embodiment

Figure 1:
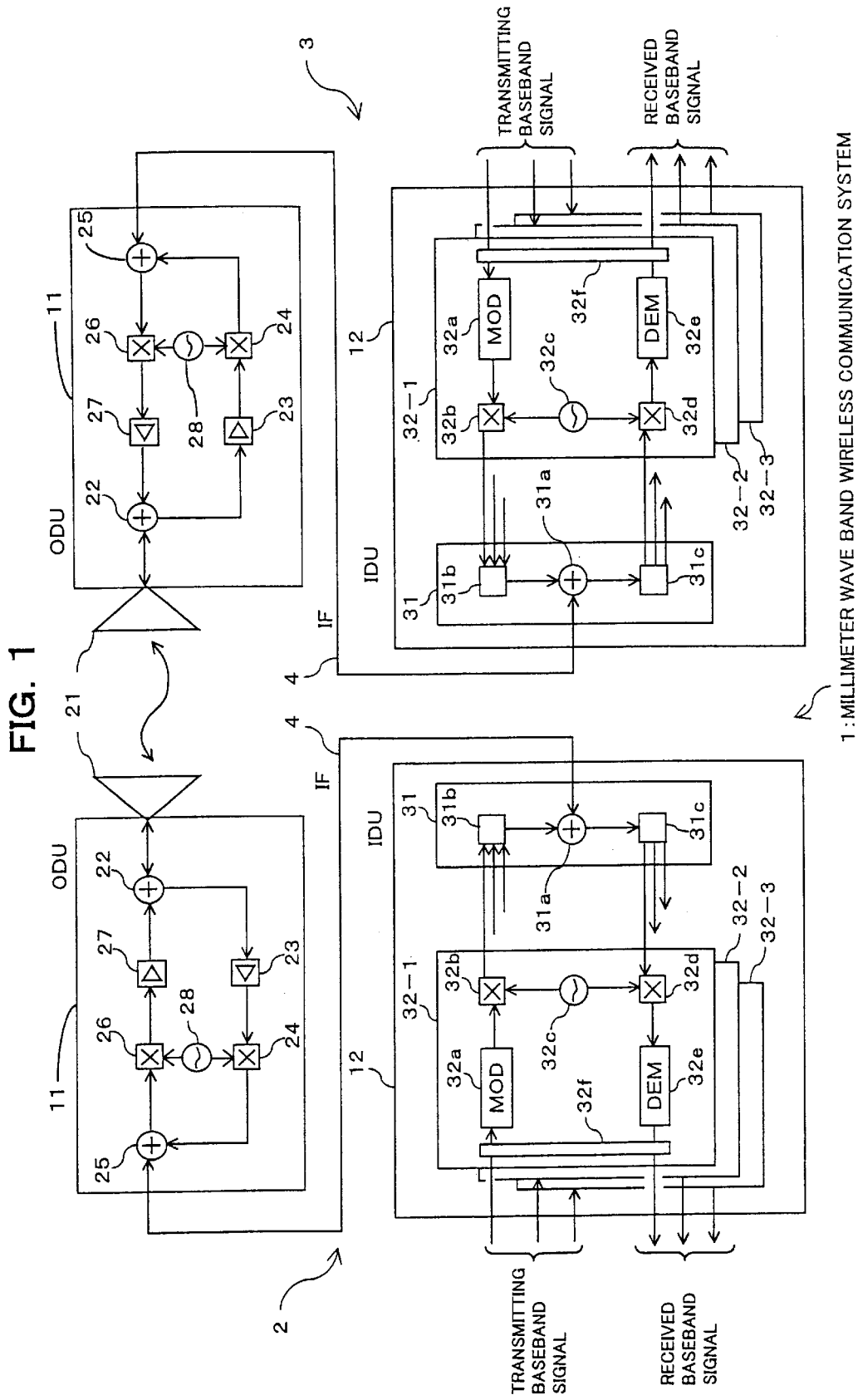
FIG. 1 is a block diagram showing an arrangement of a wireless communication system of a millimeter wave as one embodiment of the present invention.

FIG. 1 is a block diagram showing an arrangement of a wireless communication system of a millimeter wave as one embodiment of the present invention. As shown in FIG. 1, a wireless communication system 1 for a millimeter wave (hereinafter sometimes referred to as simply "system 1") is composed of a couple of millimeter wave wireless communication apparatus 2 and 3 each arranged to include an out door unit (ODU; first section) 11 and an in door unit (IDU; second section) 12 connected through a cable 4 to the ODU 11.

The ODU 11 is a unit for carrying out wireless communication with the opposing ODU 11 using a multichannel signal (carrier wave) at a millimeter wave (or quasi-millimeter wave) band. To attain the communication purpose, the ODU 11 has a main portion which is arranged to include, for example, an antenna unit 21, hybrid units (directional coupler) 22, 25, a low noise amplifier 23, mixers 24, 26, a high power amplifier 27, a local oscillator 28 and so on. In the description of the present embodiment, the term "millimeter wave band (or quasi-millimeter wave band)" means a frequency band ranging from about 13 GHz to 38 GHz.

The antenna unit 21 is a unit for transmitting and receiving a radio wave of a millimeter wave band as a transmitting signal or receiving signal (multichannel signal). The hybrid unit 22 is a unit for outputting a millimeter wave (RF: Radio Frequency) signal received by the antenna unit 21 to the side of the low noise amplifier 23. Also, the hybrid unit 22 outputs a transmitting RF signal received from the high power amplifier 27 to the antenna unit 21. That is, the hybrid unit 22 prevents that the received RF signal can be supplied to the transmitting channel (the side of the high power amplifier 27) or the transmitting RF signal can be outputted to the receiving channel (the side of the low noise amplifier 23).

The low noise amplifier 23 is a unit for amplifying the received RF signal received from the hybrid unit 22 so that the RF signal has a desired level at a low noise. The mixer 24 mixes the outputs from the low noise amplifier 23 and the local oscillator 28 so as to down-convert the received RF signal into an IF (Intermediate Frequency) signal. The received IF signal obtained by the down-conversion is outputted through the hybrid unit 25 to the IDU 12.

The hybrid 25 is arranged such that the transmitting IF signal received from the IDU 12 is fed to the mixer 26 and the received IF signal from the mixer 24 is fed to the IDU 12. The mixer 26 mixes the transmitting IF signal from the hybrid unit 25 and the output from the local oscillator 28 so as to up-convert the transmitting IF signal into an RF signal. The high power amplifier 27 is a unit for amplifying the transmitting RF signal so as to have a necessary transmitting power in accordance with the communication distance.

According to the above arrangement, in the ODU 11 shown in FIG. 1, the received RF signal received by the antenna 21 is amplified by the low noise amplifier 23. Thereafter, the amplified signal is down-converted into an IF signal by the mixer 24 and supplied to the IDU 12. On the other hand, the transmitting IF signal from the IDU 12 is up-converted by the mixer 26 and then amplified by the high power amplifier 27 and outputted from the antenna 21.

The IDU 12 is a unit for modulating a transmitting signal and then up-converting the modulated signal into the transmitting IF signal which is to be supplied to the ODU 11. The IDU 12 also down-converts the received IF signal from the ODU 11 and demodulates the down-converted signal. According to the embodiment of the present invention, the IDU 12 is arranged to process signals of three channels at maximum for transmission and reception.

Figure 2:
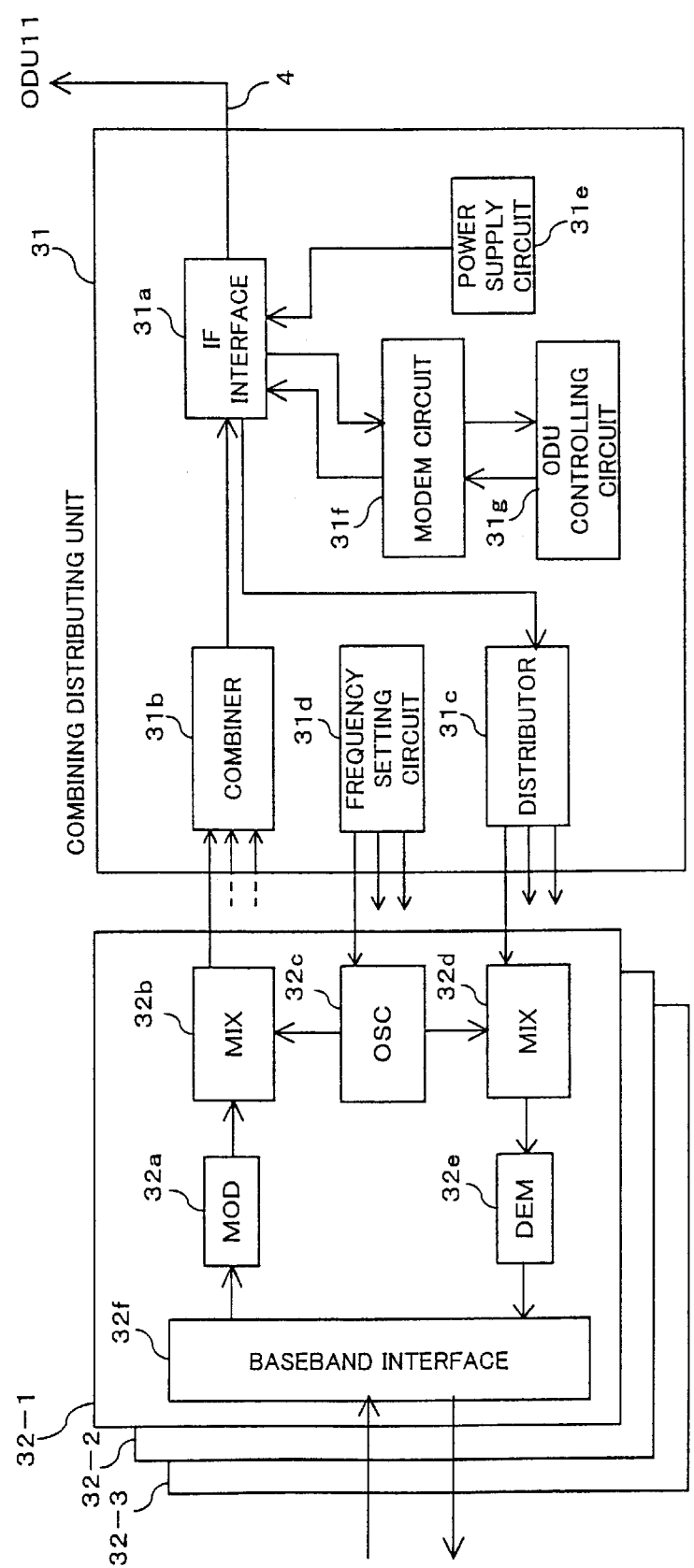
FIG. 2 is a block diagram showing in detail the arrangement of an IDU shown in FIG. 1.

That is, as shown in FIGS. 1 and 2, the IDU 12 can accommodate three channel cards (channel unit; hereinafter sometimes referred to as a panel) 32-1 to 32-3 each including a modulating unit (MOD) 32a, a demodulating unit (DEM) 32e, a mixer 32b, 32d, a PLL (Phase Locked Loop) type local oscillator (OSC) 32c and a baseband interface 32f. Further, the IDU 12 includes a combining distributing unit 31 for combining (multiplexing) transmitting IF signals from the channel cards 32-1 to 32-3 and outputting the combined signal to the ODU 11. The combining distributing unit 31 distributes a same received IF signal from the ODU 11 to each of the channel cards 32-1 to 32-3. In the following description, for convenience of explanation, the channel cards 32-1 to 32-3 are sometimes regarded as independent in-door units (IDUs), respectively, and they are denoted as IDU 32-1 to 32-3.

In the each channel cards 32-i (i=1 to 3), a baseband interface 32f is a unit for outputting the transmitting baseband signal to the modulating unit 32a and also outputting the demodulated signal from the demodulating unit 32e as a received baseband signal. The modulating unit 32a is a unit for modulating the transmitting signal (baseband signal) using a predetermined orthogonal modulation such as a QAM (Quadrature Amplitude Modulation), QPSK (Quadrature Phase Shift Keying) or the like.

The mixer (frequency converting circuit) 32b is a unit for mixing the modulated signal obtained by the modulating unit 32a and the output signal from the local oscillator 32c so as to convert (up-convert) the modulated signal into a transmitting IF signal. The transmitting IF signal obtained by the mixer 32b is outputted to a combiner 31b of the combining distributor 31.

The IDU 12 includes another mixer (frequency converting circuit) 32d. The mixer 32d is a unit for mixing the received IF signal distributed from the distributor 31c of the combining distributing unit 31 and the output from the local oscillator 32c so as to convert (down-convert) the received IF signal into a baseband signal. The demodulating unit 32e demodulates the output of the mixer 32d with the orthogonal demodulation corresponding to the above-described orthogonal modulation (e.g., QAM, QPSK or the like) so as to obtain a received signal.

As shown in FIGS. 1 and 2, the combining distributing unit 31 includes an IF interface 31a, a combiner 31b, a distributor 31c, a frequency setting circuit 31d, a power supply circuit 31e, a modulation-and-demodulation (MODEM) circuit 31f and an ODU control circuit 31g. In FIG. 1, the frequency setting circuit 31d, the power supply circuit 31e, the modulation-and-demodulation circuit 31f and the ODU control circuit 31g are not shown.

In this case, the combiner 31b is a unit for combining the transmitting IF signals received from respective channel cards 32-i. The distributor 31c is a unit for branching the received IF signal from the IF interface 31a into three branches at maximum to distribute the same signal for respective channel cards 32-i.

Figure 3:
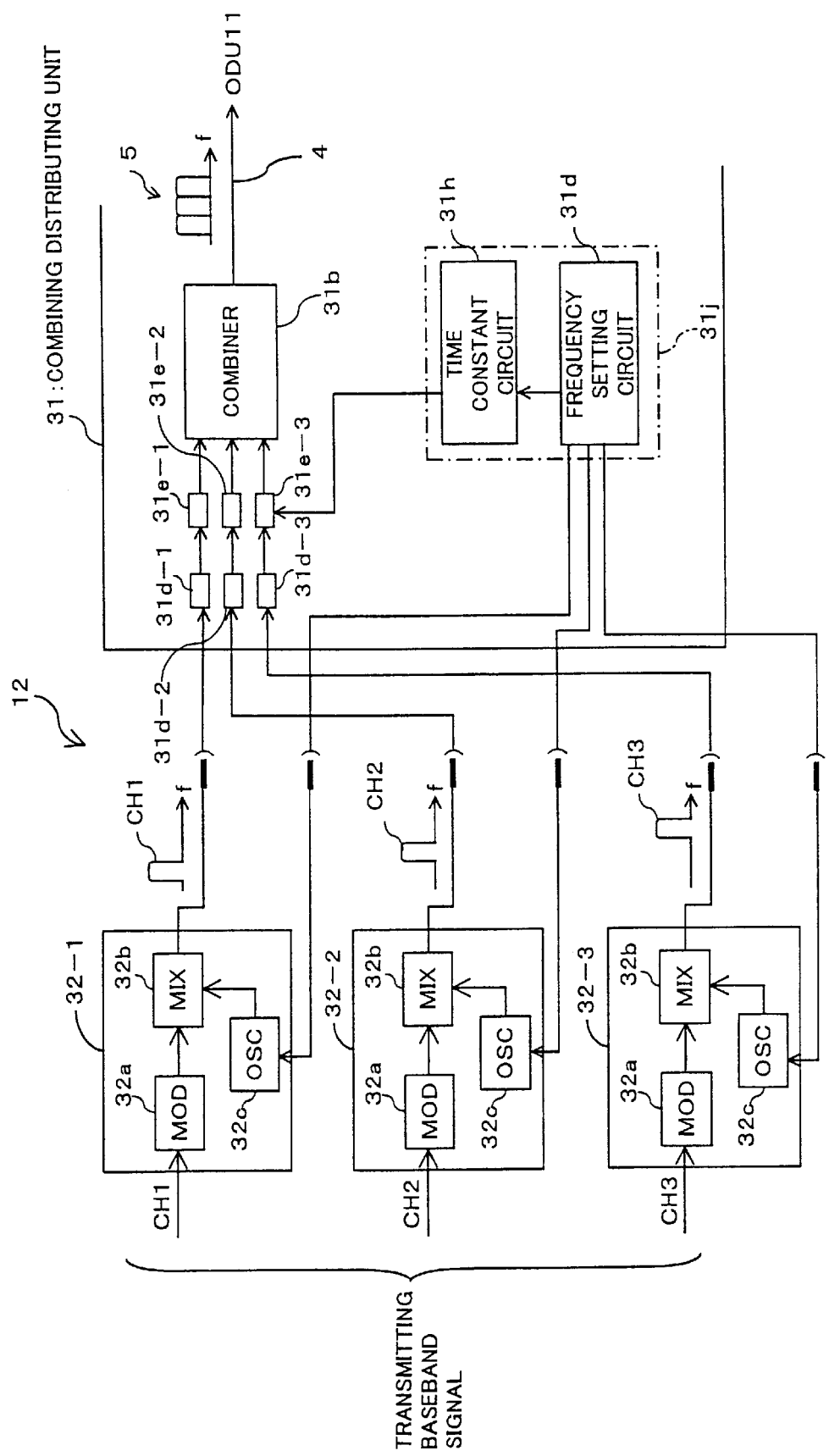
FIG. 3 is a block diagram showing the main portion of the arrangement of a transmitting system of the IDU shown in FIGS. 1 and 2.
Figure 4:
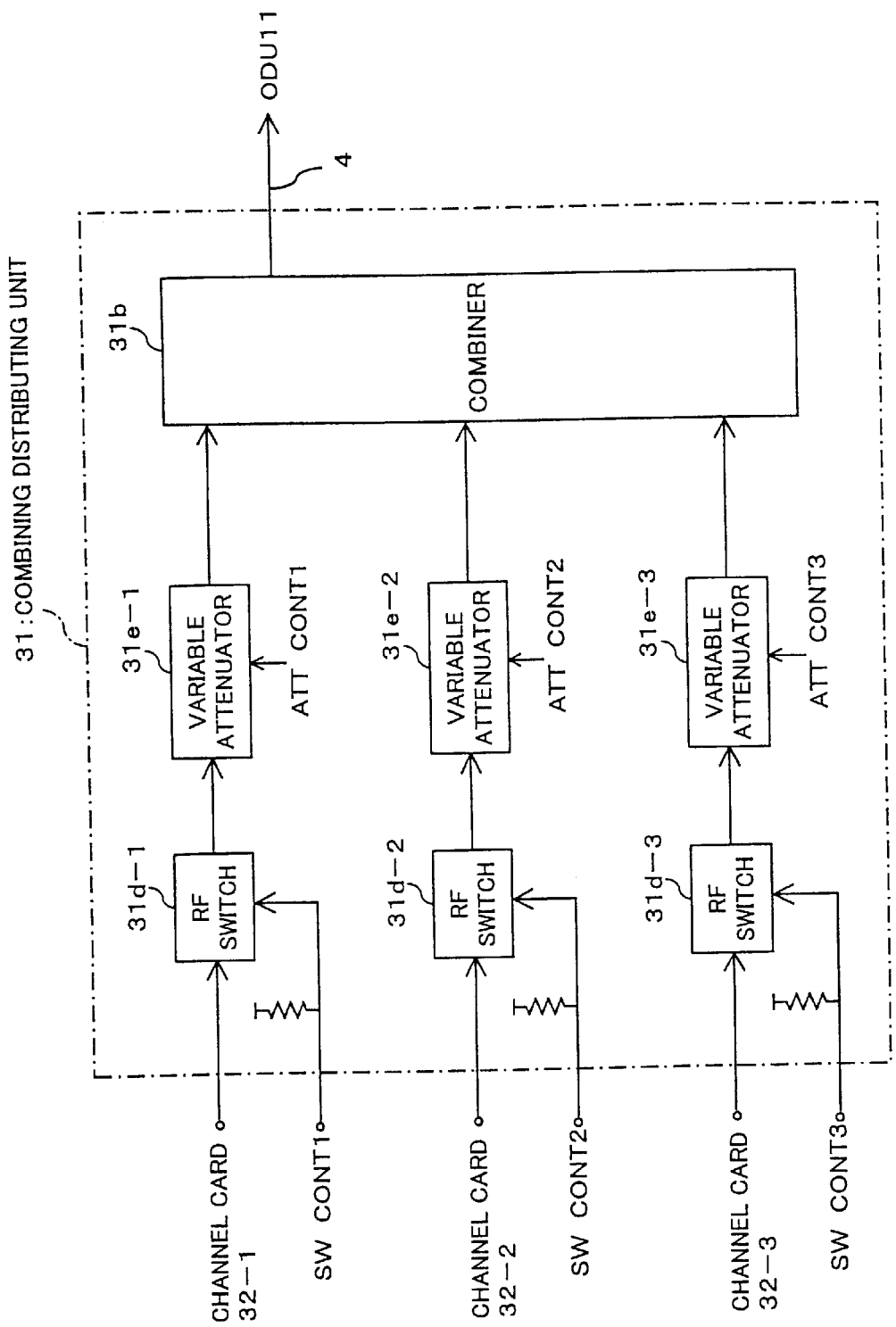
FIG. 4 is a block diagram showing in detail the main portion of a combining distributing unit shown in FIG. 2.

Although not shown in FIGS. 1 and 2, RF switches 31d-i and variable attenuators 31e-i are provided for the individual channel cards 32-i at a preceding stage of the combiner 31b, as for example shown in FIGS. 3 and 4. As described later, the degree of attenuation of the variable attenuators 31e-i are adjusted by the time constant circuit 31h, whereby the electric power for transmission can be prevented from abrupt change upon additionally providing or removing a channel card.

The IF interface 31a adds an ODU control signal generated by the ODU control circuit 31g and supplied through the modulation-and-demodulation circuit 31f and a direct current voltage (DC) signal for driving the ODU supplied from the power supply circuit 31e to the transmitting IF signal from the combiner 32a, and the resultant signal is outputted to the ODU 11. The IF interface 31a also outputs the received IF signal from the ODU 11 (multichannel signal) to the distributor 31c and outputs the ODU control signal added to the received IF signal to the MODEM circuit 31f.

The frequency setting circuit (frequency setting unit) 31d sets an oscillation frequency of the local oscillator 32c provided in each channel card 32-i so as to set an operation frequency (channel frequency) of the channel card 32-i according to a frequency of a channel signal, that is to be processed by the corresponding channel card 32-i, constituting the multichannel signal transmitted and received between the ODUs 11. The frequency setting circuit 31d also generates a drive (activate) signal for the time constant circuit 31h for controlling the degree of attenuation of the variable attenuator 31e-i.

Figure 5:
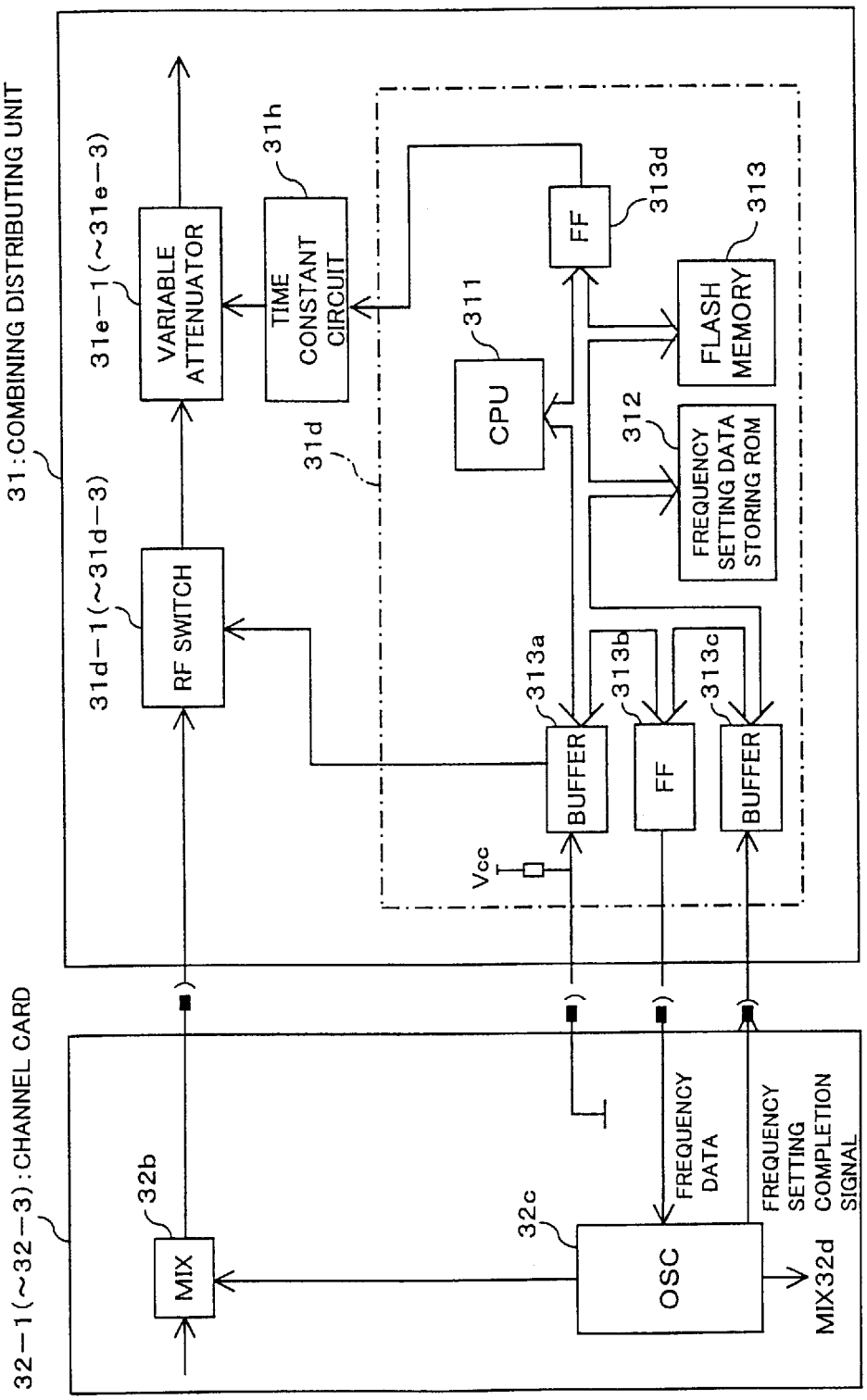
FIG. 5 is a block diagram showing in detail the main portion of a frequency setting circuit shown in FIG. 2.

In order to attain the above function, as for example shown in FIG. 5, the frequency setting circuit 31d includes in its main portion, a CPU (Central Processing Unit) 311, a ROM 312, a flash memory 313, buffers 313a, 313c, and FF (flip-flop) circuits 313b, 313d.

In this case, the buffer 313a is a unit for holding a panel connection confirmation signal (slot addition confirmation signal) when the channel card 32-i is mounted to a slot. When the buffer holds the panel connection confirmation signal, the CPU 311 recognizes an addition of the channel card 32-i to the slot and reads PLL frequency setting data which is stored in the ROM in advance. Then, the CPU 311 transfers the data to the local oscillators 32c of the respective channel cards 32-i through the FF circuit 313b. In this way, the oscillation frequency is set to each of the local oscillator 32c.

The buffer 313c receives from the local oscillator 32c a frequency setting completion signal which indicates that the oscillating frequency of the local oscillator 32c is locked and the frequency setting is completed in response to that the PLL frequency setting data is transferred, and holds the frequency setting completion signal. When the frequency setting completion signal is held in the buffer 313c, the CPU 311 generates the activate signal to the time constant circuit 31$h$ through the FF circuit 313$d$ so as to control the degree of attenuation of the variable attenuator 31$e$-$i$ corresponding to the channel card 31-$i$ in which the frequency setting is carried out.

The local oscillator 32$c$ is arranged to supply oscillation signal to both of the up-converting (transmitting channel) mixer 32$b$ and the down-converting (receiving channel) mixer 32$d$. Therefore, the frequency conversion in the transmitting channel and the receiving channel are naturally carried out based on the same frequency setting. Further, the ROM 312 is arranged to have stored therein a program, data and the like which are necessary for the CPU 311 to operate satisfactorily. Further, as will be described with reference to FIG. 12, the flash memory 313 is arranged to have stored therein data indicative of the relationship between the slot and the frequency assigned to the slot so that the same channel frequency is not assigned to a plural number of slots when frequency assignment is effected on the channel cards 32-$i$ (slot).

In FIG. 2, the power supply circuit 31$e$ is a unit for generating a direct current voltage (DC) signal (ODU driving signal) for driving the ODU 11. The ODU control circuit 31$g$ is a unit for generating a control signal (ODU control signal) for controlling the ODU 11 of its own side. The MODEM circuit 31$f$ modulates the ODU control signal generated by the ODU control circuit 31$g$. The MODEM circuit 31$f$ also demodulates a modulated ODU control signal received from the branch of the IF interface 31$a$.

The transmitting ODU control signal transmitted to the ODU 11 is utilized for setting a frequency to the ODU 11 or ALC (Automatic Level Control) in the ODU 11. The received ODU control signal supplied from the ODU 11 is utilized for informing the IDU of the arriving of a signal or alarming information.

According to the above construction of the IDU 12, the transmitting signal is modulated by the modulating unit 32$a$ in the channel card 32-$i$, and then the modulated signal is up-converted into the transmitting IF signal by the mixer 32$b$. In this way, as shown in FIG. 3, the outputs from respective channel cards 32-$i$ (transmitting IF signals; CH1 to CH3) are assigned with frequencies by the frequency setting circuit 31$d$ so that each frequency is different from one another.

The outputs from respective channel cards 32-$i$ are combined together by the combining unit 31$b$ to form a transmitting multichannel (carrier) signal (see reference numeral 5 in FIG. 3) and the combined signal is outputted to the IF interface 31$a$. The IF interface 31$a$ adds the transmitting ODU control signal (see reference numeral 6A in FIG. 6) generated from the ODU control circuit 31$g$ and the DC signal (see reference numeral 7 in FIG. 6) received from the power supply circuit 31$e$ to the transmitting multi-carrier signal (see "IDU→ODU" in FIG. 6). The IF interface 31$a$ also outputs this signal to the ODU 11 through the cable 4.

On the other hand, a received multichannel signal ("RF-U") which is down-converted by a IF signal in the ODU 11, is outputted to the IF interface 31$a$. In the IF interface 31$a$, the received ODU control signal added by the self-station side ODU 11 (see reference numeral 6B in FIG. 6) is extracted to the MODEM circuit 31$f$. Then, the received multichannel signal is outputted to the distributor 31$c$ and the distributor 31$c$ branches the multichannel signal to the corresponding channel card 32-$i$. When the individual channel cards 32-$i$ receive the multichannel signal, the mixer 32$d$ down-converts the received multichannel signal 32-$i$ distributed by the distributor 31$c$, and thereafter the down-converted signal is demodulated by the demodulating unit 32$e$ to obtain a received signal.

In FIG. 6, a diagram surrounded by a frame C1 illustrates an example of a frequency arrangement of an input-output signal of the ODU 11. Also, a diagram surrounded by a frame C2 illustrates an example of a frequency arrangement of a received signal and a transmitting signal of the antenna unit 21. Further, in the diagram surrounded by the frame C1, the notation "IDU→ODU" represents a transmitting signal in the IF band and the notation "ODU→IDU" represents a received signal in the IF band. Also, in the diagram surrounded by the frame C2, the notation "RF-L" represents a transmitting signal in a millimeter wave band and the notation "RF-U" represents a received signal in a millimeter wave band.

In this case, according to the ITU-R recommendation, the channel frequency arrangement of the transmitting signal "RF-L" and the received signal "RF-U" are arranged as shown in FIGS. 21 and 22, when the signals lie in a 18 GHz band. That is, as will be understood from FIGS. 21 and 22, according to the ITU-R recommendation, an interval of channel frequencies in the 18 GHz band is regulated to be 7 MHz.

The difference between the channel frequency arrangement of the transmitting signal "RF-L" and the received signal "RF-U" is as follows. That is, when signal transmission is carried out at the channel frequency arrangement of "RF-L", signal receiving is carried out at the channel frequency arrangement of "RF-U". Conversely, when signal transmission is carried out at the channel frequency arrangement of "RF-U", signal receiving is carried out at the channel frequency arrangement of "RF-L".

As described above, according to the arrangement of the IDU 12 of the present embodiment, even if each of the channel cars 32-$i$ has completely the same construction, the channel frequency setting is effected based on the above-described frequency setting circuit 31$d$ of the combining distributing unit 31. Therefore, each of the channel card 32-$i$ can satisfactorily modulate and demodulate the channel signal with a desired frequency and transmit and receive the same signal.

In other words, each of the channel cards 32-$i$ of the present embodiment is not fixedly assigned with a frequency of a signal that the channel card shall process. Therefore, each of the channel cards 32-$i$ can process any channel signal. Accordingly, an operator or the like can insert the channel card 32-$i$ into an arbitrary channel slot position of the combining distributing unit 31.

Incidentally, consideration is made on a matter that the above-described channel card 32-$i$ is additionally provided or removed to increase or decrease the number of carrier waves. In this case, if the channel card 32-$i$ is simply inserted into or removed from the channel slot of the combining distributing unit 31 without any control, the transmitting power will abruptly change, with the result that the existing channel in service is negatively influenced.

According to the present embodiment, in order to avoid such phenomenon, as shown in FIGS. 3 and 4, there are provided an RF switch 31$d$-1 to 31$d$-3 and a variable attenuator 31$e$-1 to 31$e$-3 for individual channel at the preceding stage of the combiner 31$b$.

Each of the above RF switches 31$d$-1 to 31$d$-3 controls the ON/OFF status of the transmitting IF signal from the corresponding channel card 32-$i$. For example, each of the RF switch 31$d$-$i$ receives a panel connection confirmation signal which is generated when the channel card 32-i is mounted, as a switch control signal (SW CONT1-3), whereby the status of the switch becomes ON state and the transmitting IF signal from the channel card 32-i is supplied to the variable attenuator 31e-i.

Figure 8:
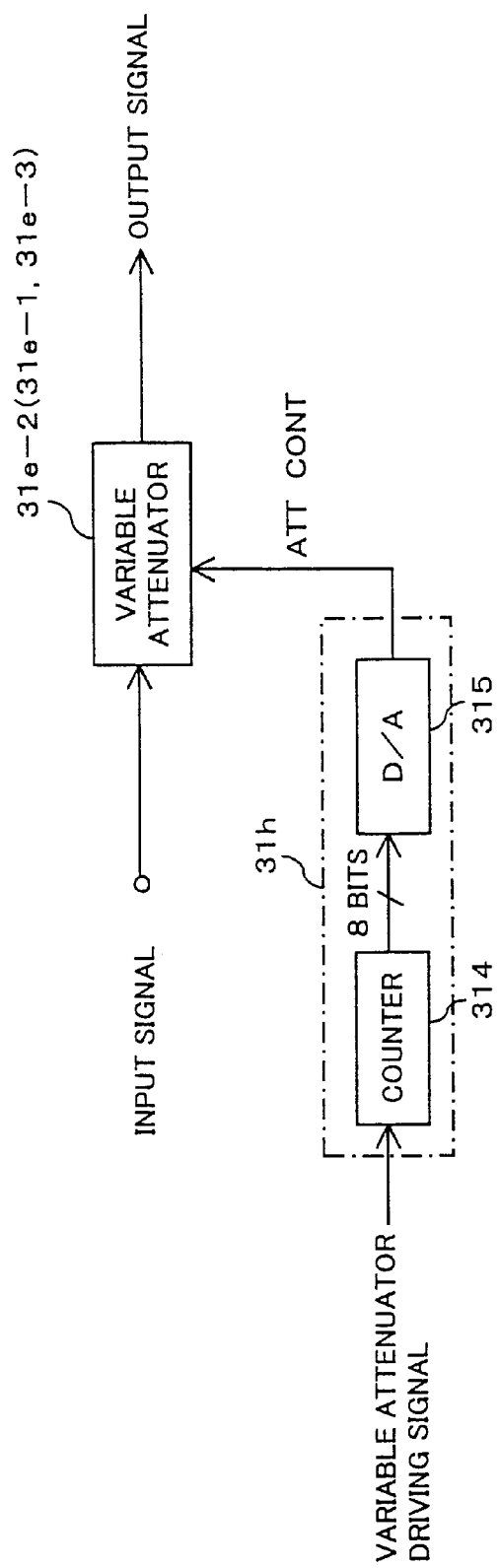
FIG. 8 is a block diagram showing an arrangement of a time constant circuit shown in FIG. 6(A)

Further, each of the variable attenuator 31e-i is controlled in its degree of attenuation by an attenuator control signal (ATT CONT 1–3), whereby the output level of the transmitting IF signal from the RF switch 31d-i can be adjusted. The attenuator control signal is, as for example shown in FIG. 7(A) and FIG. 8, created by the aforementioned time constant circuit 31h having a counter 314 and a digital-to-analog (D/A) converter 315.

That is, if the panel connection confirmation signal becomes ON state, the CPU 311 of the frequency setting circuit 31d generates an activate signal after the aforementioned frequency setting completion. When the activate signal is supplied to the counter 314, the counter 314 increments or decrements its count. Thus, the attenuator control signal (digital 8 bits) is created. The attenuator control signal is converted into an analog signal by the D/A converter 315 and the converted signal is outputted to the variable attenuator 31e-i. Thus, the variable attenuator 31e-i can be smoothly controlled in its degree of attenuation. In this way, the level of the transmitting IF signal outputted to the combiner 31b can be increased or decreased with smoothness. Although only one time constant circuit 31h is illustrated in FIG. 3, it is to be understood that the time constant circuit 31h is provided for every channel.

Description will be made on how the RF switch 31d-i and the variable attenuator 31e-i are operated when the channel card 32-1 has been mounted.

Initially, when only the channel card 32-1 is mounted, the RF switch 31d-1 takes the status of ON and the variable attenuator 31e-1 is set to a state in which the attenuator 31e-1 provides no attenuation. Remaining RF switches 31d-2 and 31d-3 take the status of OFF and the variable attenuators 31e-2 and 31e-3 are set to be an infinite attenuation (there is no output therefrom). With this condition, if the channel card 32-2 is inserted into a channel slot to increase the number of channels, the corresponding switch control signal (SW CONT 2) is supplied to the RF switch 31d-2 and the RF switch 31d-2 is turned on.

At this time, since the variable attenuator 31e-2 is kept to be infinite attenuation, the transmitting IF signal from the channel card 31e-2 (hereinafter sometimes referred to as additionally provided card 31e-2) will not be supplied to the combiner 31b. When frequency setting is completed for the local oscillator 32c for the additionally provided card 32-2, the CPU 311 of the frequency setting circuit 31d generates an attenuator activate signal for the variable attenuator 31e-2 so as to activate the counter 314. Thus, the attenuator control signal (ATT CONT 2) is controlled so that the degree of attenuation is gradually decreased.

However, the manner for setting the frequency and degree of attenuation carried out by the frequency setting circuit 31d (CPU 311) becomes slightly different depending on the cases that the assigned frequency is determined in advance for every slot and that the new frequency to be assigned is determined based on the relationship with the frequency already assigned to the mounted slot.

Figure 11:
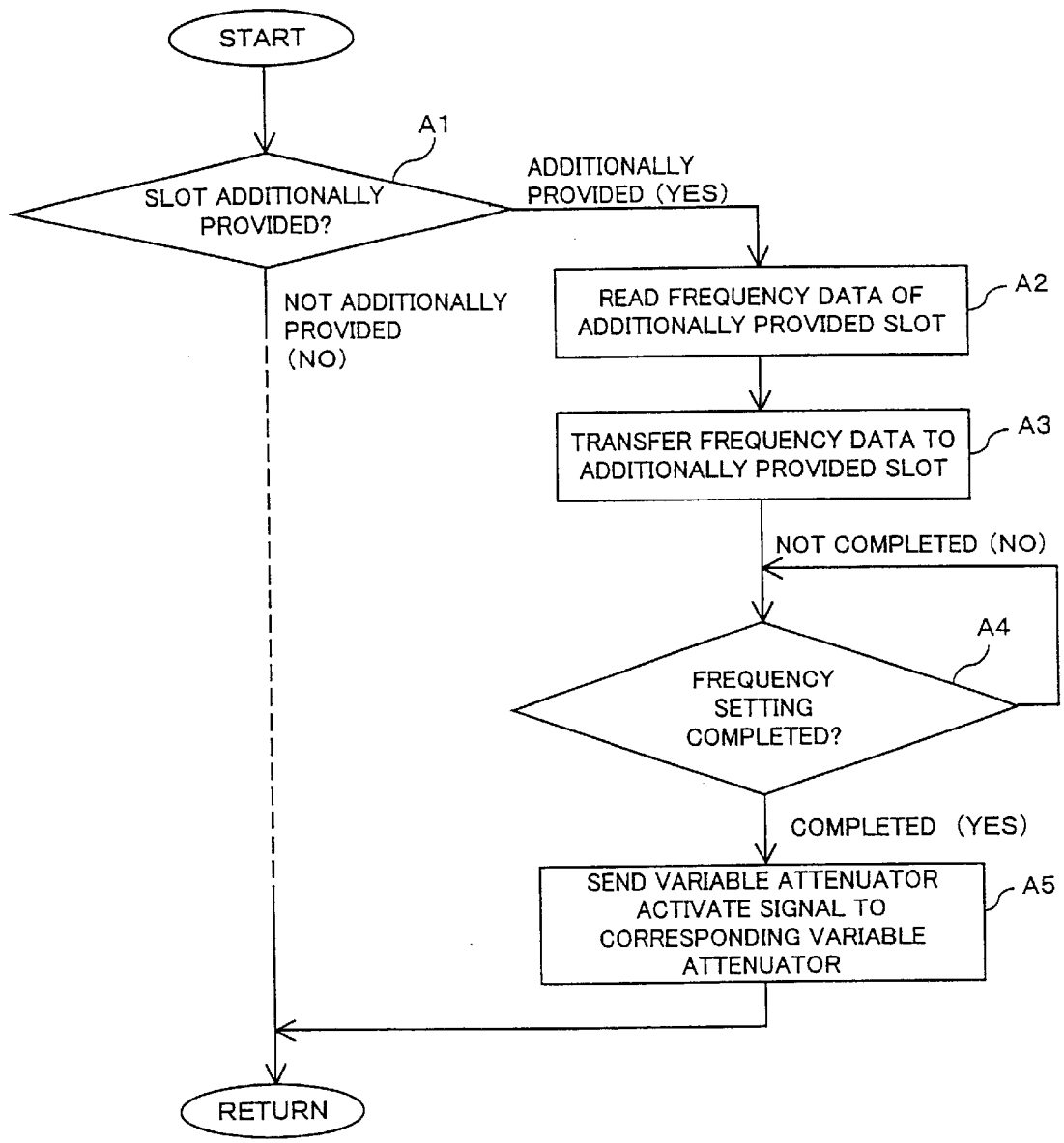
FIG. 11 is a flowchart for explaining frequency setting and variable attenuator adjustment carried out by the frequency setting circuit of the present embodiment.

That is, in the former case, as for example shown in FIG. 11, the CPU 311 monitors the status of the signal to determine whether the panel connection conformation signal is generated or not (NO route of step A1). If it is confirmed that the panel connection confirmation signal has a status of ON and a slot (channel card 32-2) is additionally provided (YES route of step A1), then the CPU 311 reads PLL frequency setting data from the memory 312 (step A2) and transfers the PLL frequency setting data to the local oscillator 32c of the additionally provided card 32-2 of the corresponding slot (step A3).

Thereafter, the CPU 311 confirms whether the frequency setting with the PLL frequency setting data to the additionally provided slot is completed or not (step A4). If it is confirmed that the frequency setting is completed (YES route of step A4), then the CPU 311 sends the variable attenuator activate signal to the counter 314 of the corresponding time constant circuit 31h (step A5). In this way, a processing for the additionally provided slot is completed.

Figure 12:
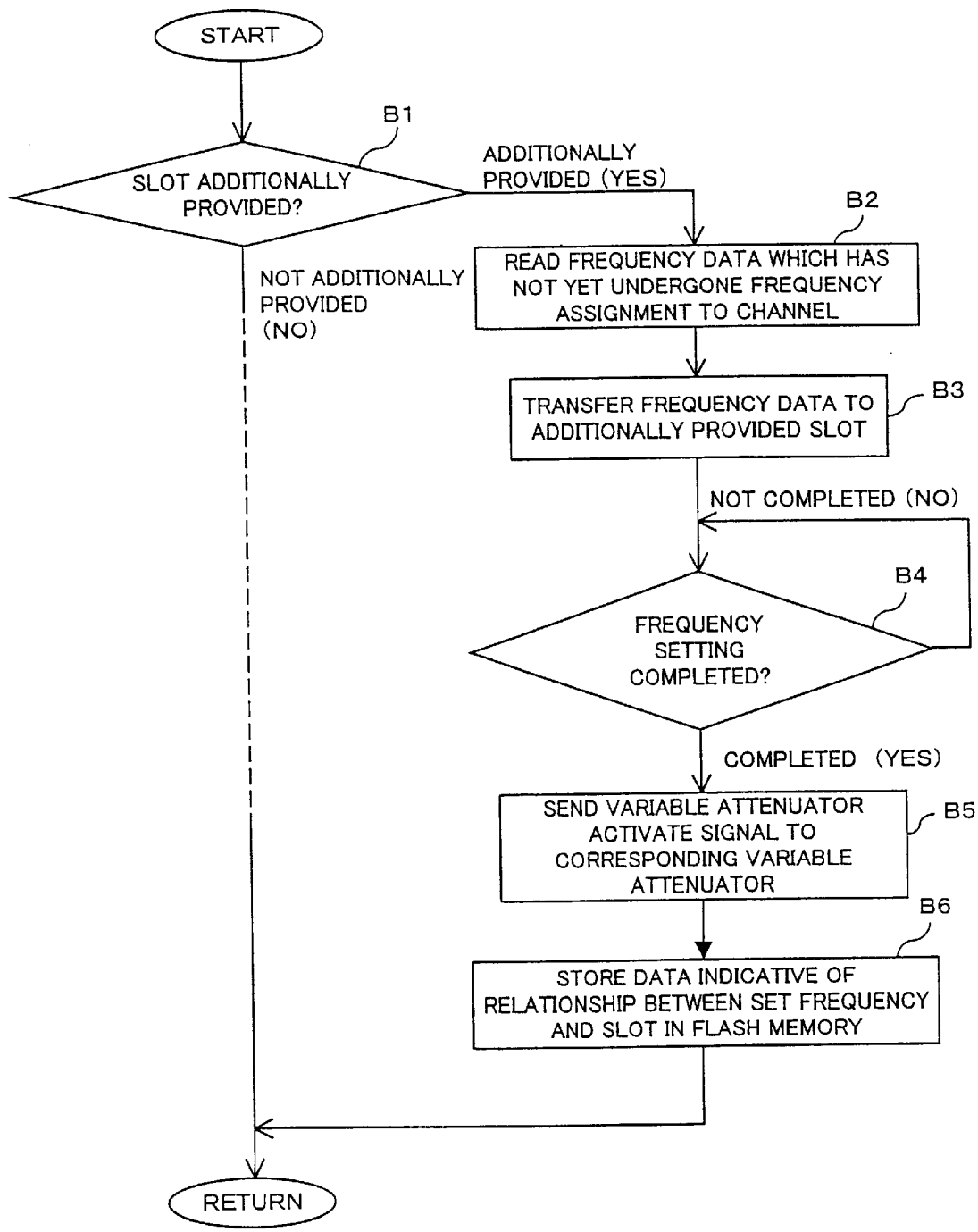
FIG. 12 is another flowchart for explaining frequency setting and variable attenuator adjustment carried out by the frequency setting circuit of the present embodiment.

In the latter case, that is, in case where the new frequency to be assigned is determined based on the relationship with the frequency already assigned to the mounted slot, as for example shown in FIG. 12, the CPU 311 monitors the status of the signal to determine whether the panel connection confirmation signal is generated or not (NO route of step B1). If it is confirmed that the channel slot is additionally provided (YES route of step B1), the CPU 311 reads from the memory 312, PLL frequency setting data which has not yet undergone frequency assignment to the channel card, on the basis of the PLL frequency setting data stored in advance in the memory 312 and a frequency which is stored in the flash memory 313 and has been assigned to the channel card (step B2). Then, the CPU 311 transfers the data to the local oscillator 32c of the additionally provided card 32-2 of the corresponding slot.

Thereafter, the CPU 311 confirms whether the frequency setting with the setting data for the additionally provided card in the slot is completed or not (step B4). If it is confirmed that the frequency setting is completed (YES route of step B4), the CPU 311 sends the variable attenuator activate signal to the counter 314 of the corresponding time constant circuit 31h (step B5). Then, the CPU 311 stores the data indicative of the relationship between the set frequency and slot in the flash memory 313 upon use of the next power supply start (step B6). Thus, a processing for the additionally provided slot is completed.

Meanwhile, the counting rate of the counter 314 is set so that ALC (Automatic Level Control) of the ODU 11 can follow the change of level of the transmitting IF signal in response to the attenuation degree control. That is, as for example shown in FIG. 7(A), if the time constant of the ALC circuit 29 of the ODU 11 is set to T2 and the time constant of the time constant circuit 31h is set to T1, the counting rate of the counter 313 is set so as to satisfy the relationship of T1>T2.

That is, the time constant circuit 31h is arranged to control the degree of attenuation of the variable attenuator 31e-i based on the time constant T1 which is larger than the time constant T2 of ALC of a radio signal of the ODU 11.

With the above arrangement, as for example schematically shown in FIGS. 7(B) to 7(D), even if the channel card 32-2 is additionally provided so that a transmitting IF signal of one wave amount is added, the automatic level control of the ODU 11 will follow. Thus, it becomes possible to avoid the state that the output power (total transmitting power) of ODU 11 is generated excessively, as for example shown in FIG. 7(E).

FIG. 7(B) illustrates the states of IDU output ① and ODU output ② before the channel card is additionally provided. FIG. 7(C) illustrates the states of IDU output ① and ODU output ② at a transient state after the channel card is additionally provided (the time constant circuit is going to be driven). And FIG. 7(D) illustrates the states of IDU output ① and ODU output ② at a state of completion of the time constant circuit operation after the channel card is additionally provided. Further, FIG. 7(E) illustrates an ODU output ② when the relation between the time constants T1 and T2 is T1≦T2 (output power is excessively supplied).

Figure 9A:
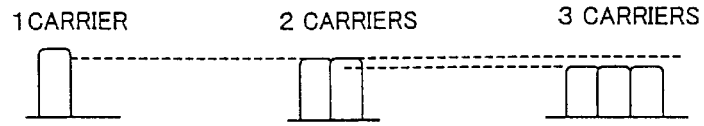
FIGS. 9(A) and 9(B) is a diagram illustrative of an ALC (Automatic Level Control) effected in the ODU of the present embodiment when no offset is settled.
Figure 9B:
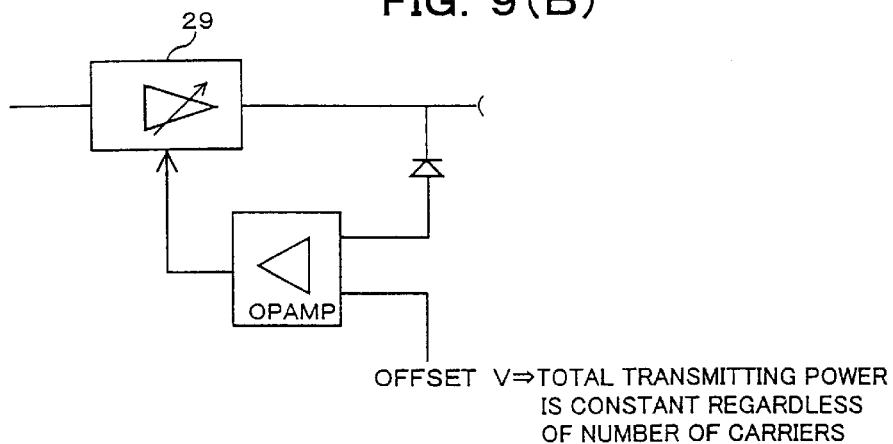
Figure 10A:
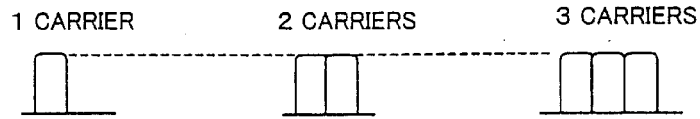
FIGS. 10(A) and 10(B) is a diagram illustrative of an ALC effected in the ODU of the present embodiment when an offset is set.
Figure 10B:
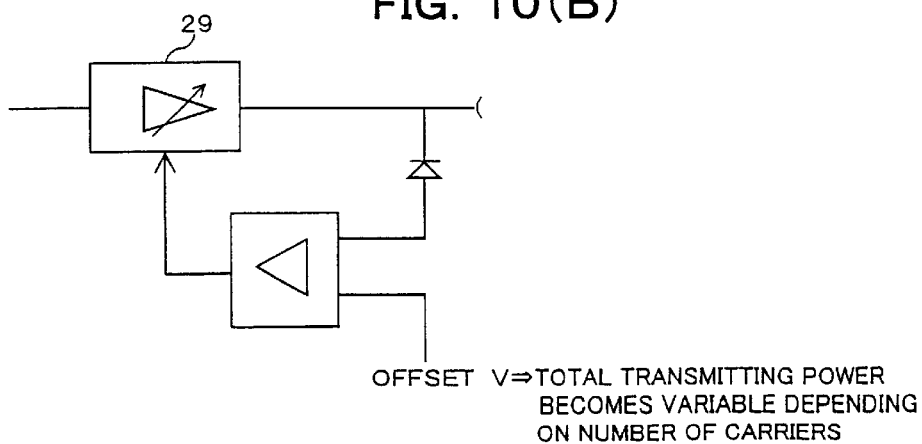

The automatic level control is effected under the following two modes, i.e., a mode in which the total transmitting electric power (hereinafter simply referred to as "total power") is set to constant regardless of the number of channels (carrier wave) (see FIGS. 9(A) and 9(B)) (mode "1") and a mode in which the total transmitting electric power is made variable depending on the number of carrier waves so that the transmitting electric power per single carrier is made constant (see FIGS. 10(A) and 10(B)) (mode "2").

When the automatic level control is effected under the former mode (mode "1"), the offset voltage setting of the automatic level control is not carried out (i.e., the voltage is set constant regardless of the number of carriers). Therefore, although the total power does not drop with the increase of the carrier number, the gain of the signal calculated on the basis of a single carrier is decreased by about 3 dB per unit carrier upon two wave outputs and by about 5 dB per unit carrier upon three wave outputs. Conversely, when the automatic level control is effected under the latter mode (mode "2"), the offset voltage setting for the automatic level control is variably carried out depending on the change of the carrier number, whereby the power for a single carrier is made constant.

As shown in FIGS. 7(C) and 7(D), the above-described embodiment is arranged on the basis of that the former mode "1" is employed. That is, in this case, the electric power for unit carrier is decreased in response to the increase of the carrier number. However, the distance between the millimeter wave band wireless communication apparatus 2 and 3 is so determined that a signal can be transmitted in a wireless fashion with the lowered power.

While in the above embodiment description has been made on a case where a channel card is additionally provided, even if the channel card that has been already provided is removed (e.g., the channel card 32-i is removed), the arrangement can also suppress the negative influence on the channels in service. That is, contrary to the case of addition of a card, the corresponding variable attenuator 31e-i is controlled so that the degree of attenuation thereof is gradually increased from the state of no attenuation to the infinite attenuation, and then the channel card 32-i is removed (at this time, the RF switch 31d-i is made to have the OFF status). Also in this case, the transmitting power can be prevented from abrupt change and the arrangement can suppress the negative influence on the channels in service.

That is, the frequency setting circuit 31d and the time constant circuit 31h of the present embodiment function as a control unit 31j (see FIG. 3) for controlling the degree of attenuation of the variable attenuator 31e-i in response to the change of channel number deriving from increase or decrease of channel card.

Now, operation of the receiving channel of the IDU 12 will be described.

Figure 13:
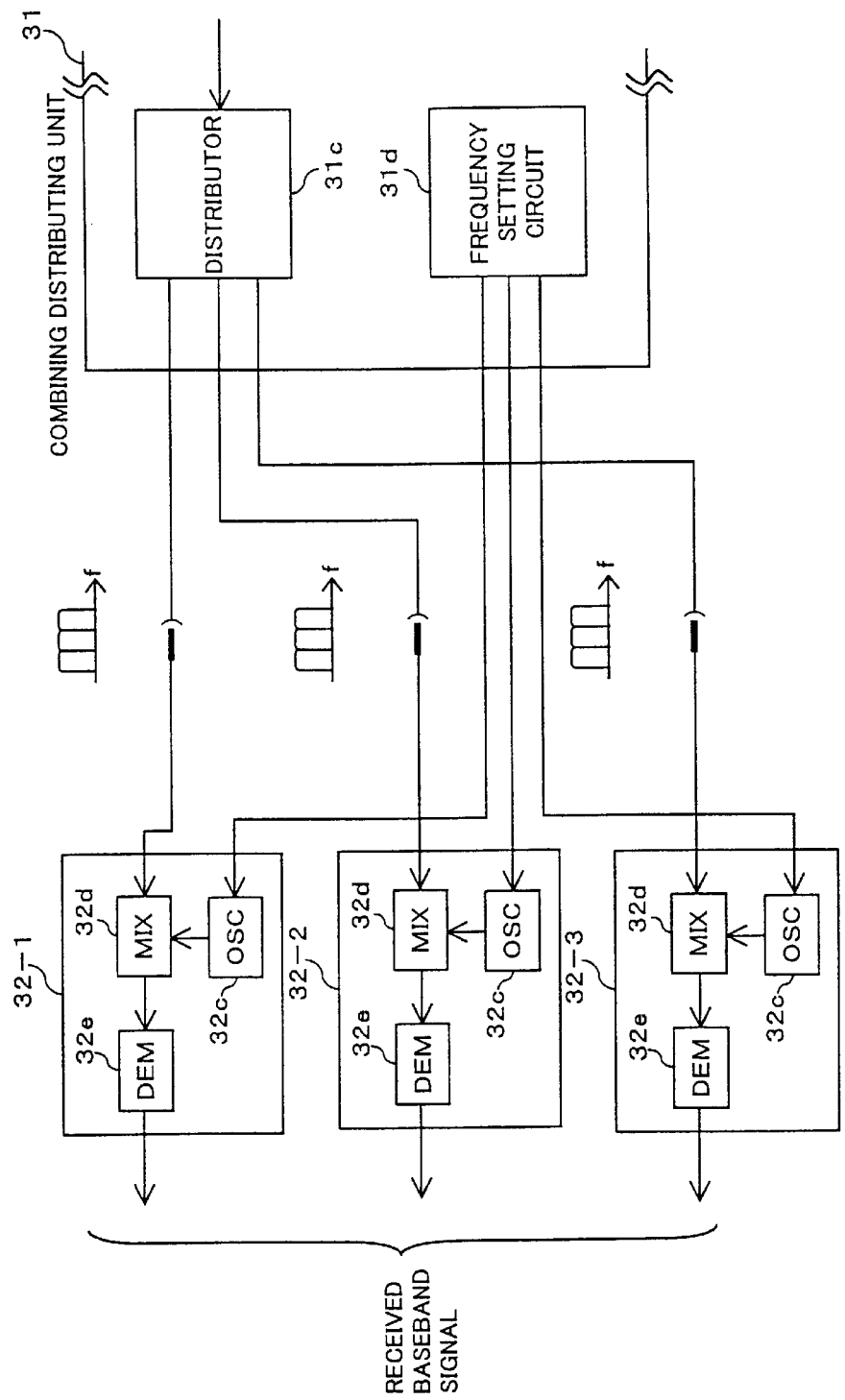
FIG. 13 is a block diagram showing the main portion of the arrangement of a receiving system of the IDU shown in FIGS. 1 and 2.

As shown in FIG. 13, a received multi-carrier signal (received IF signal) from the ODU 11 is inputted to the distributor 31c through the IF interface 31a, as described above, and the signal is distributed to respective channel cards 32-i by the distributor 31c. That is, each of the channel cards 32-i is inputted with exactly the same received IF signal.

In each of the channel cards 32-i, the oscillation frequency is set for the local oscillator 32c by the above-described frequency setting operation made by the frequency setting circuit 31d. Then, the received IF signal is down-converted by the mixer 32d with the frequency, with the result that only the predetermined frequency component (channel signal) is extracted from the received multi-carrier signal and the extracted signal is demodulated by the demodulating unit 32e.

According to the recommendation of the aforementioned ITU-R, as shown in FIG. 21, the channel frequency arrangement in 18 GHz band (18G-L) at 4×2 MHz mode is composed of three frequencies of CH1=17724 MHz, CH2=17731 MHz and CH3=17738 distributed at 7 MHz interval. Therefore, if a clock frequency is (CLK)=4.68365 MHz and the interval of the local oscillator frequency between each channel is 2×CLK, the relation between the frequency bands (CH1 to CH3) of respective channel signals and the local oscillator frequencies $f_{CH1}$ to $f_{CH3}$ becomes as illustrated in FIG. 14, for example.

Therefore, in this case, in each of the channel cards 32-1 to 32-2, an output frequency arrangement after the down-converting by the mixer 32c takes a state illustrated in FIGS. 15(A) to 15(C), and hence a frequency component shown with a hatched portion is extracted as a channel signal having a frequency which is set by the frequency setting circuit 31d.

Figure 14:
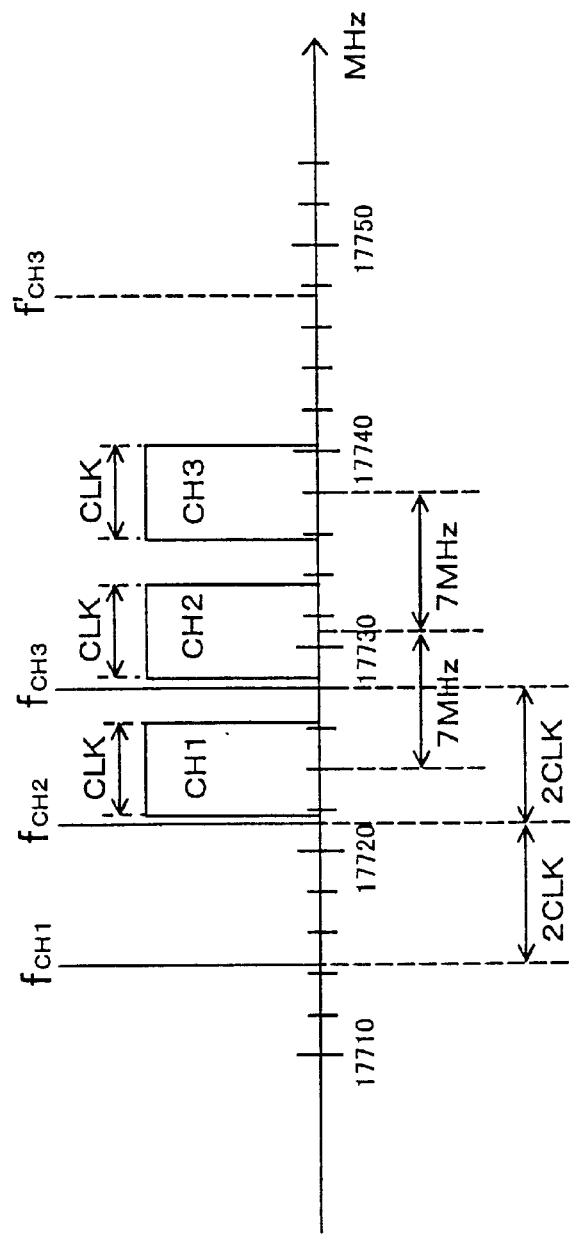
FIG. 14 is a diagram schematically showing the relation between the channel frequency arrangement and the local oscillator frequencies according to the present embodiment.

However, in the channel card 32-1, if the received signal is down-converted by using the local oscillator frequency $f_{CH3}$ shown in FIG. 14, as described above, because the frequency arrangement has relationship of the channel interval of 7 MHz and the local oscillator frequency interval of 2×CLK, as is schematically illustrated in FIG. 15C, the frequency component of "CH1" suffers from aliasing and the distribution profile is folded, with the result that the frequency components of "CH1" and "CH2" are overlaid on one another.

When the frequency components of "CH1" and "CH2" are overlaid on one another as described above, as is illustrated with the half-tone notation portion of FIG. 15(D), the overlaid frequency component is spread toward the side of "CH3" as a distortion component. Thus, it becomes difficult to precisely demodulate the signal of the "CH3" channel of the channel card 32-3.

Thus, according to the present embodiment, as shown in FIG. 14 with a broken line, the local oscillator frequency for the local oscillator 32c of the channel card 32-3 is set to be shifted to the higher frequency side from the original center frequency of the "CH3" by a distance which is equal to the distance from the center frequency of the "CH1" to the local oscillator frequency $f_{CH1}$, by the above-mentioned frequency setting circuit 31d.

If the frequency setting is made as described above, as is schematically illustrated in FIG. 15(E), in the channel card 32-3, the sideband relationship is reversed (channel order is reversed) for the "CH3" after the down-converting of the mixer 32d.

That is, in the frequency setting circuit 31d, the local oscillator frequency for the IDU 32-3 for the highest side channel signal ("CH3") of the multichannel signal is shifted to the frequency remote to the higher side by a frequency distance which is equal to the distance from the center frequency of the multichannel signal band to the local oscillator frequency for the lowest band side multichannel signal ("CH1"). In this way, the local oscillator frequencies of the respective channel card 32-i are set so that the frequency arrangement of the channel signals ("CH1" to "CH3") obtained by the down-converting carried out by the mixer 32d can be made free from overlaying in the multichannel signal frequency band.

However, if the received multichannel signal has modulated by an orthogonal modulation such as the QAM upon transmission and the signal is demodulated based on an orthogonal demodulation under the condition that the sideband relationship is reversed as described above, the relationship between the demodulated I- and Q-channels of the demodulated signal is also reversed. Therefore, if no countermeasure is taken, the signal of the "CH3" will not be demodulated correctly. For this reason, as for the channel in which the local oscillation frequency is shifted by the frequency setting circuit 31d as described above, the I-channel and Q-channel shall be exchanged with each other on the transmitting side or the receiving side.

If the exchanging operation of the I-channel and Q-channel is carried out on the transmitting side, as for example illustrated in FIGS. 16(A) and 16(B), an I/Q selector (a unit for exchanging I-channel and Q-channel with each other on the transmitting side) 322 is provided between the modulator (in this case, QAM modulator (LSI)) and the digital-to-analog converters 323 and 324 in the modulating unit 32a. In this arrangement, as for the channel in which the local oscillation frequency is shifted by the frequency setting circuit 31d (in the above example, "CH3"), the digital output of the I-channel and the digital output of Q-channel of the QAM modulator 321 are exchanged with each other.

In other words, in this case, the frequency setting circuit 31d effects a shift setting operation of the local oscillator frequency on the highest side channel signal ("CH3") of the multichannel signal which is transmitted from the opposing ODU 11 as an opponent of the wireless communication under the condition that the transmitting I-channel and transmitting Q-channel are exchanged with each other by the IDU 12 (channel card 32-3) of the millimeter wave band wireless communication apparatus 3 (2).

The I/Q selector 322 may be provided at the following stage of the digital-to-analog converters 323 and 324 so that the channel exchange is effected on the analog I/Q channel signals. However, if the I/Q channel outputs are exchanged with each other on the digital base, such exchange operation can be carried out on the bit-unit basis. Therefore, there is an advantage that control is more simplified.

Figure 17:
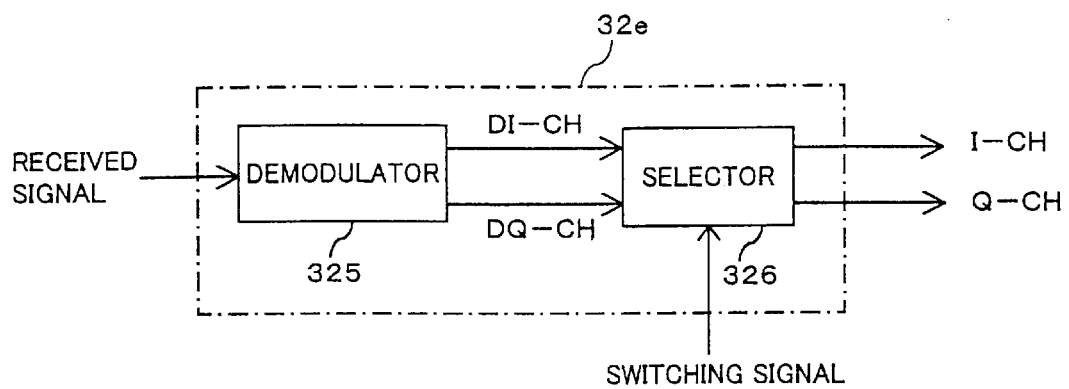
FIG. 17 is a block diagram showing the arrangement (upon exchanging I-channel and Q-channel with each other) of a demodulating unit shown in FIGS. 1 and 2.

Conversely, if the I/Q channel exchange is carried out on the receiving side, as for example shown in FIG. 17, the demodulating unit 32e is arranged to have an I/Q selector (a unit for exchanging the I-channel and Q-channel with each other on the receiving side) 326 carrying out the exchange operation in accordance with a truth table shown in the next table 1. Thus, the exchange operation between the I-channel and Q-channel can be carried out after demodulation. In the following table 1, a notation "DQ" represents a digital Q-channel signal and "DI" a digital I-channel signal.

TABLE 1

TRUTH TABLE

| SWITCHING | OUTPUT UNIT | |
|---|---|---|
| SIGNAL | I-CH | Q-CH |
| 1 | DQ | DI |
| 0 | DI | DQ |

In this way, even if the highest frequency band side "CH3"-signal is subjected to the frequency shift on the local oscillator frequency for down-convert for avoiding the aliasing phenomenon of the channel frequency after down-converting, it becomes possible to demodulate the "CH3"-signal correctly.

As described above, according to the millimeter wave band wireless communication apparatus 2 and 3 of the present embodiment, it becomes possible to effectively avoid a negative influence on the channels in service and excessive output power in the ODU 11 deriving from the increase or decrease of the transmitting channel number on the transmitting side. Also, according to the millimeter wave band wireless communication apparatus 2 and 3 of the present embodiment, if the receiving system employs an arrangement in which the received multichannel signal is simply distributed by the distributor 31c so that each of the IDU 32-i is inputted with the same signal, in order to make the IDUs 32-i common to any channel frequencies, it becomes possible to avoid the overlap which derives from the IF channel frequency arrangement based on the ITU-R recommendation and the aliasing of channel frequencies upon down-converting.

Figure 18A:
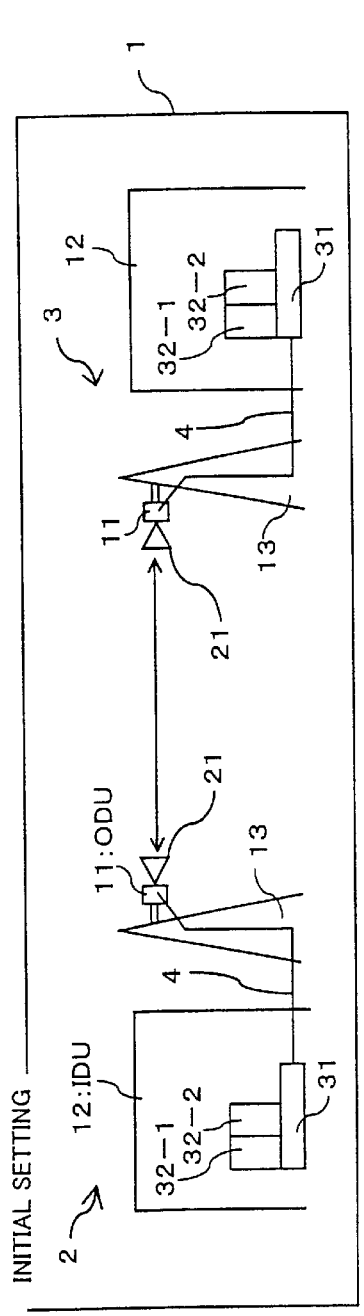
FIGS. 18(A) to 18(C) are block diagrams each illustrative of a manner for changing the channel number of the millimeter wave wireless communication system according to the present embodiment.
Figure 18B:
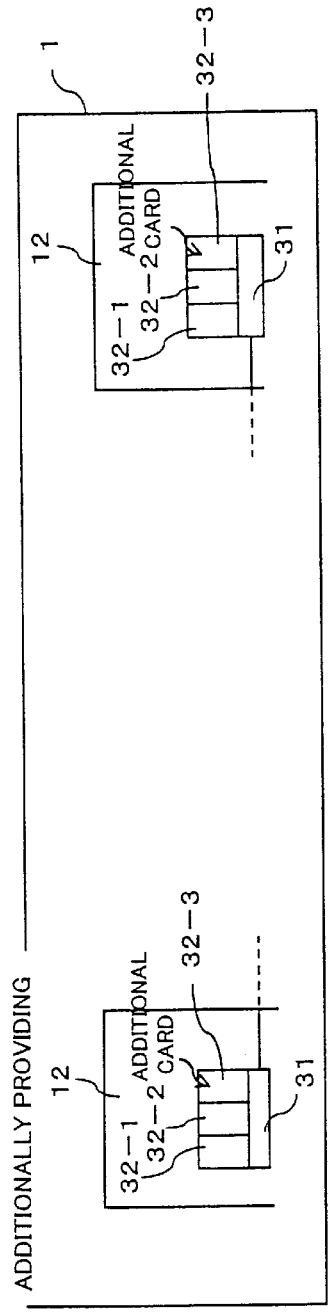
Figure 18C:
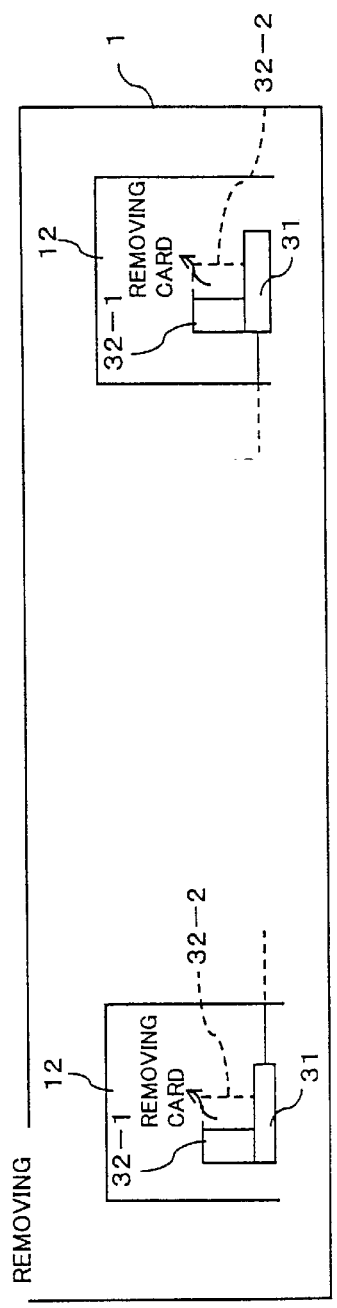

Therefore, as schematically shown in FIGS. 18(A) to 18(C), if the transmission capacity (channel number) of the millimeter wireless communication system 1 is to be increased from the initial transmission capacity, to increase only the number of IDU 32-i is sufficient for attaining the purpose. Conversely, if the transmission capacity is to be decreased, to decrease the number of IDUs 32-i is sufficient counter measure for attaining the purpose. In addition, the IDU 32-i can be utilized as a channel card of any channel frequencies. Therefore, IDU 32-i can be designed at a low cost.

Figure 19:
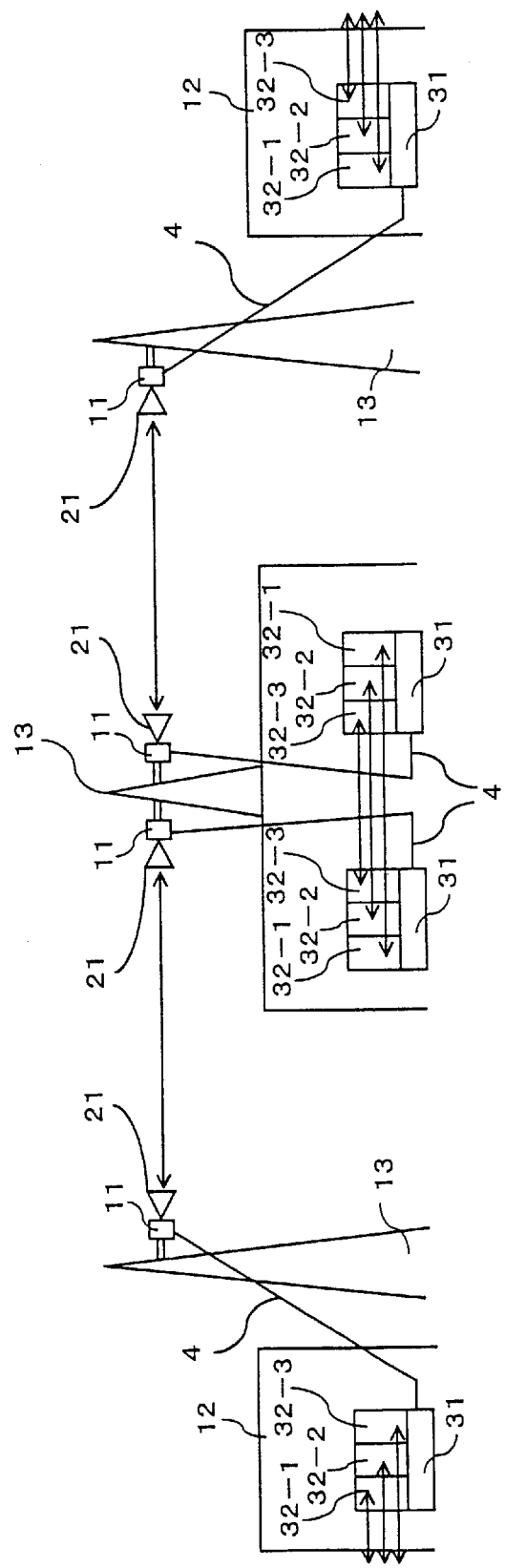
FIG. 19 is a block diagram showing the millimeter wave wireless communication system according to the present embodiment in which the wireless communication apparatus are coupled to one another in a multi-hop connection manner.

Further, as for example shown in FIG. 19, if the wireless communication system is arranged as a multi-hop system, to increase or decrease the transmission capacity can be similarly attained by only increasing or decreasing the number of IDUs 32-i. Therefore, the cost for constructing the system can be remarkably decreased. In FIGS. 18 (A) and 19, reference numeral 13 represents a steel tower on which the ODU 11 is provided.

Figure 20:
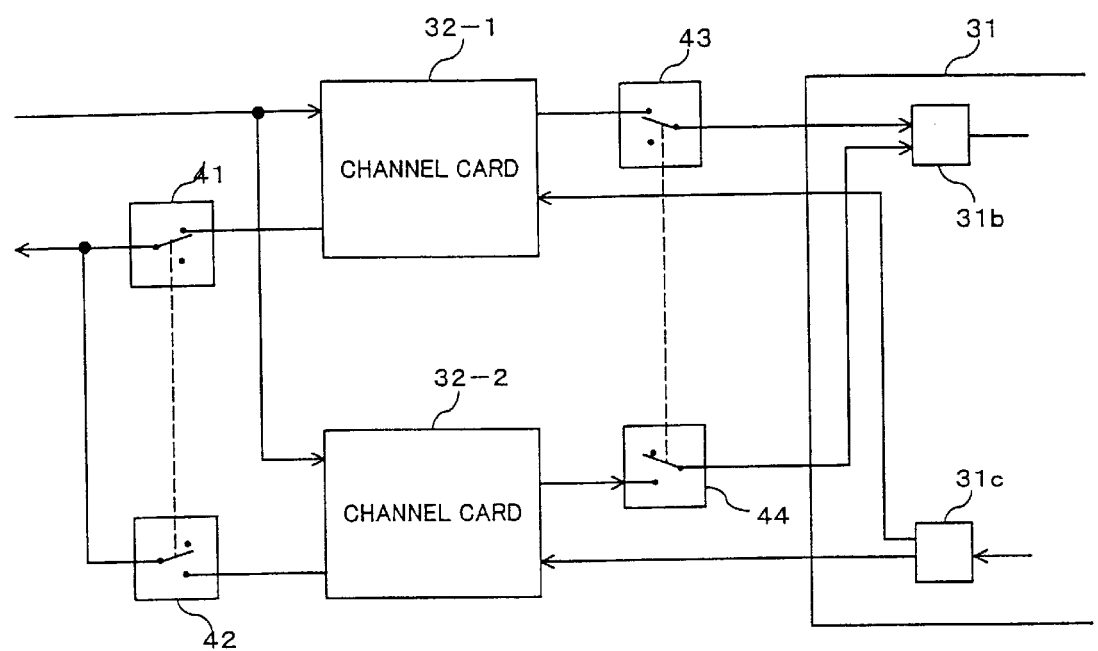
FIG. 20 is a block diagram showing another arrangement of the millimeter wave wireless communication apparatus according to the present embodiment in which the channel units are redundantly provided.
Figure 23:
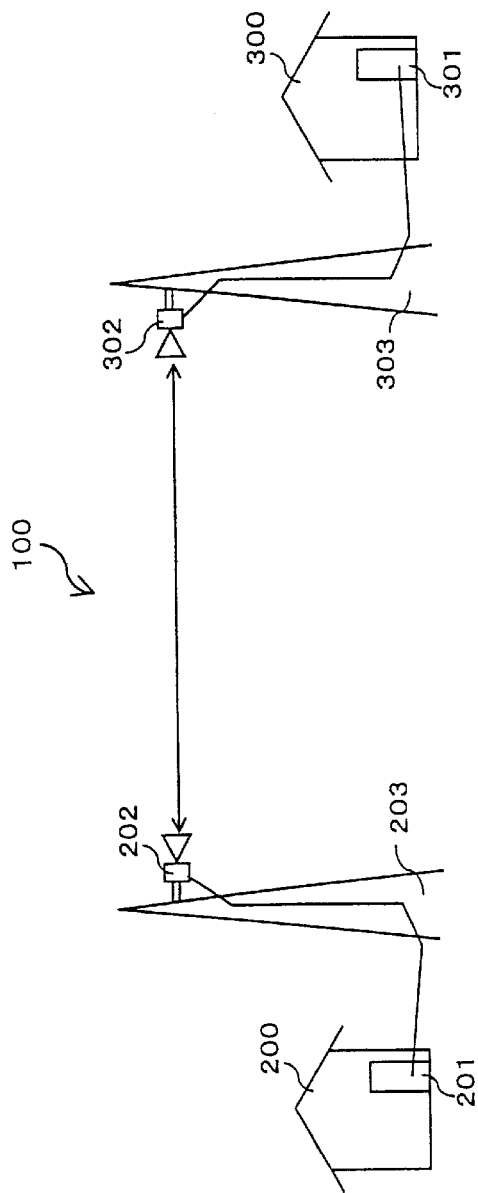
FIG. 23 is a block diagram showing one example of a conventional wireless communication system of a millimeter wave (or quasi-millimeter wave)
Figure 25:
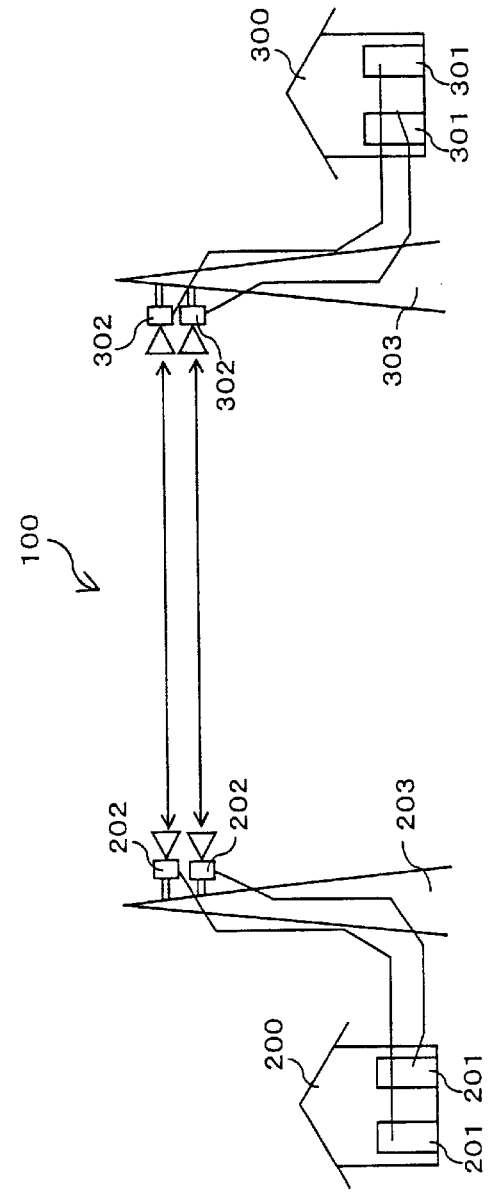
FIG. 25 is a diagram illustrative of a problem which the conventional wireless communication system of a millimeter wave encounters.
Figure 24:
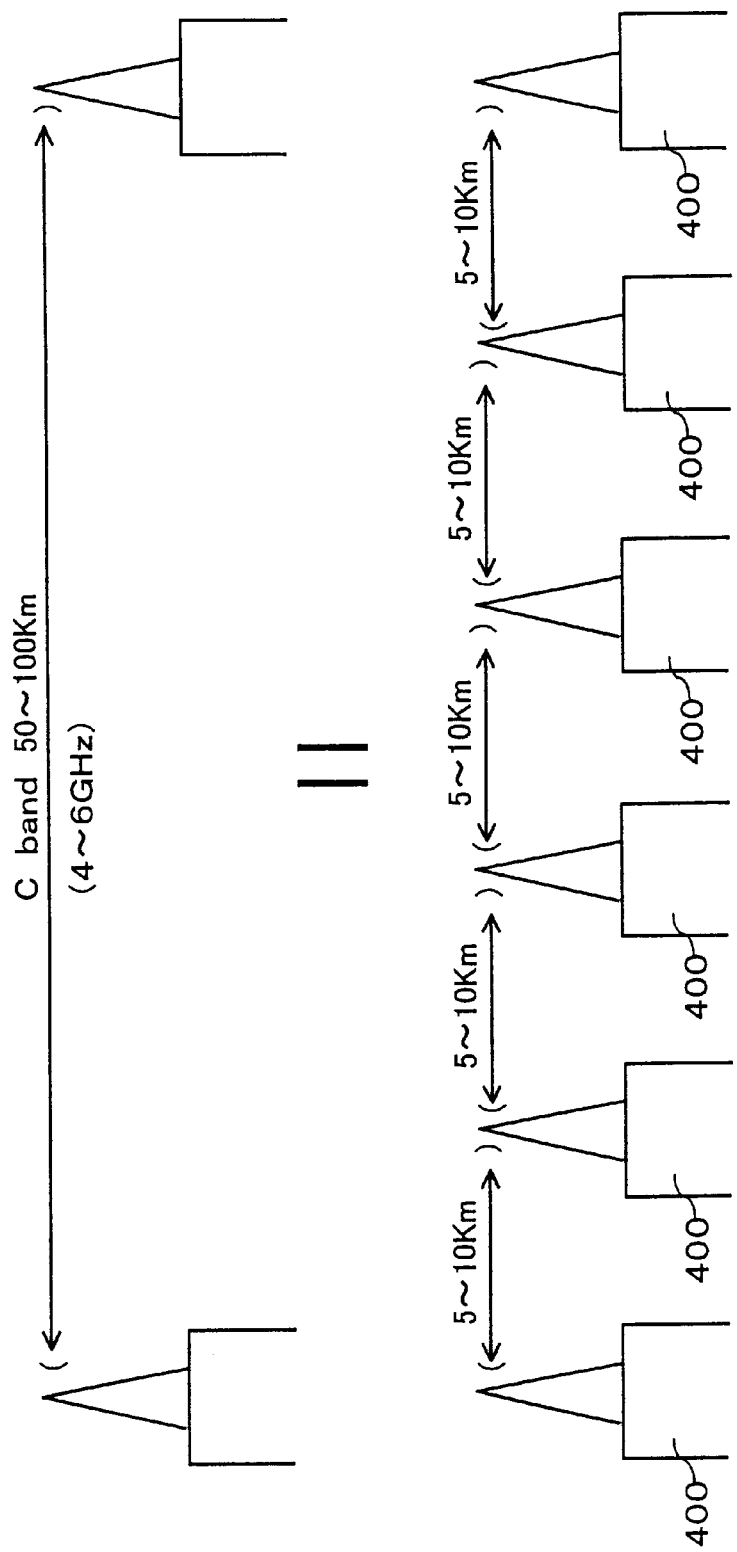
FIG. 24 is a block diagram showing one example of a conventional wireless communication system in which the wireless communication apparatus are coupled to one another in a multi-hop connection manner.

Meanwhile, while in the above embodiment description has been made on an assumption that the channel cards 32-i process different main signals (channel signals), respectively, as for example shown in FIG. 20, the channel card 32-1 and the channel card 32-2 may be made to be inputted with the same main signal (channel signal) and baseband selecting switches 41 and 42 and IF signal selecting switches 43 and 44 may be provided so that one of the outputs from the channel cards 32-1 and 32-2 is utilized as a work channel and the other of the same is utilized as a protection channel.

In this case, the selecting switches 41 to 44 can function as a selecting unit for selecting an output from outputs of the plurality of IDUs 32-1 and 32-2 which process the same channel signal owing to the setting of the frequency setting circuit 31d. According to the arrangement, even if a currently utilized channel (e.g., "CH1") is damaged and becomes incapable in operation for signal transmission, the signal transmission can be continued by using the preparatory channel (e.g., "CH2"). Thus, the reliability of the system 1 can be remarkably increased.

(B) Other Disclosure

In the above embodiments description has been made on a case in which the millimeter wave band communication apparatus 2 and 3 are respectively arranged as a transmitting-and-receiving apparatus including a transmitting system and a receiving system. However, the present invention is not limited to the embodiment but each of the millimeter wave band communication apparatus 2 and 3 may be arranged as a system exclusively utilized for transmission or reception.

While in the above embodiment the number of IF channels is set to three at maximum, the merit or advantage of the present invention can be similarly obtained even if the number IF channels is set to four or more. Moreover, while in the above embodiment the combining distributing unit 31 is provided with the variable attenuators 31e-i and the RF switches 31d-i, the combining distributing unit 31 may be arranged to be provided with only the variable attenuators 31e-i. Also in this case, it becomes possible to suppress an abrupt change of the transmission power.

The present invention is not limited to the above-described embodiments but various changes and modifications can be effected without departing from the gist of the present invention.

What is claimed is:

1. A wireless communication apparatus having a first section for carrying out wireless communication with a multichannel signal and a second section having a plurality of channel units each processing a predetermined frequency signal as a channel signal, the wireless communication apparatus comprising:

a plurality of variable attenuators each provided for a corresponding one of the channel signals received from each channel unit of the second section;

a combiner for combining outputs from the respective variable attenuators together and outputting the resultant combined signal to the first section; and a control unit detects a variation of a number of channel signals based upon a connection confirmation signal from the channel units and, in response to the detection controlling the degree of attenuation of the individual variable attenuators according to the variation of the number of the channel signals.

2. A wireless communication apparatus according to claim 1, wherein one or more of the plurality of channel units are arranged to process the same channel signal, and a selecting unit for selecting one of outputs from the channel units which are arranged to process the same channel signal is further provided.

3. A wireless communication apparatus according to claim 2, wherein the first section is arranged as a wireless communication apparatus using a millimeter wave band or quasi-millimeter wave band for the wireless communication.

4. A wireless communication apparatus according to claim 1, wherein the first section is arranged as a wireless communication apparatus using a millimeter wave band or quasi-millimeter wave band for the wireless communication.

5. A wireless communication apparatus having a first section for carrying out wireless communication with a multichannel signal and a second section having a plurality of channel units each processing a predetermined frequency signal as a channel signal, the wireless communication apparatus comprising:

a plurality of variable attenuators each provided for a corresponding one of the channel signals received from each channel unit of the second section;

a combiner for combining outputs from the respective variable attenuators together and outputting the resultant combined signal to the first section; and a control unit for controlling the degree of attenuation of the individual variable attenuators according to the variation of the number of the channel signals, wherein the control unit comprises a time constant circuit for controlling the degree of attenuation of the variable attenuators with a time constant which is larger than a time constant for automatic level control of a radio signal of the first section.

6. A wireless communication apparatus according to claim 5, wherein one or more of the plurality of channel units are arranged to process the same channel signal, and a selecting unit for selecting one of outputs from the channel units which are arranged to process the same channel signal is further provided.

7. A wireless communication apparatus according to claim 6, wherein the first section is arranged as a wireless communication apparatus using a millimeter wave band or quasi-millimeter wave band for the wireless communication.

8. A wireless communication apparatus according to claim 5, wherein the first section is arranged as a wireless communication apparatus using a millimeter wave band or quasi-millimeter wave band for the wireless communication.

9. A wireless communication apparatus having a first section for carrying our wireless communication with a multichannel signal and a second section having a plurality of channel units each processing a predetermined frequency signal as a channel signal, the wireless communication apparatus comprising:

a distributor for distributing the multichannel signal received from the first section to respective channel units; and a frequency setting unit for setting an operating frequency of a channel unit according to a frequency of the channel signal, which is to be processed in the corresponding channel unit, constituting the multichannel signal distributed to respective channel units by the distributor; wherein each of the channel units is provided with a frequency-variable type frequency converting circuit for subjecting the multichannel signal to frequency-conversion with a desired local oscillator frequency so as to obtain the channel signal, and the frequency setting unit is arranged to set the local oscillator frequency by said operating frequency so that the frequency arrangement of the channel signals obtained from the frequency-conversion contains no overlap within the band of the multichannel signal.

10. A wireless communication apparatus according to claim 9, wherein the frequency setting unit sets a local oscillator frequency to a channel unit for the highest frequency band side signal of the multichannel signal so that the local oscillator frequency is distant from the central frequency to the higher frequency side by a distance which is equal to the distance from the central frequency to a local oscillator frequency of a channel unit for the lowest frequency band side signal of the multichannel signal.

11. A wireless communication apparatus according to claim 10, wherein each of the channel unit comprises a demodulating unit for effecting orthogonal demodulation on the output from the frequency converting circuit, and a receiving side I/Q channel exchanging unit for exchanging a demodulated I-channel signal and a demodulated Q-channel signal, each of which is obtained by the demodulation of the demodulating unit, with each other.

12. A wireless communication apparatus according to claim 11, wherein the first section is arranged as a wireless communication apparatus using a millimeter wave band or quasi-millimeter wave band for the wireless communication.

13. A wireless communication apparatus according to claim 10, wherein the frequency setting unit is arranged to carry out the frequency setting on the highest side channel signal of the multichannel signal received by the first section, the highest side channel signal of the multichannel signal being transmitting from an opponent wireless communication apparatus having a channel unit in which a transmitting I-channel signal and a transmitting Q-channel signal are exchanged with each other.

14. A wireless communication apparatus according to claim 13, wherein the first section is arranged as a wireless communication apparatus using a millimeter wave band or quasi-millimeter wave band for the wireless communication.

15. A wireless communication apparatus according to claim 10, wherein the first section is arranged as a wireless communication apparatus using a millimeter wave band or quasi-millimeter wave band for the wireless communication.

16. A wireless communication apparatus according to claim 9, wherein each of the channel unit comprises a demodulating unit for effecting orthogonal demodulation on the output from the frequency converting circuit, and a receiving side I/Q channel exchanging unit for exchanging a demodulated I-channel signal and a demodulated Q-channel signal, each of which is obtained by the demodulation of the demodulating unit, with each other.

17. A wireless communication apparatus according to claim 16, wherein the first section is arranged as a wireless communication apparatus of a millimeter wave band or quasi-millimeter wave band.

18. A wireless communication apparatus according to claim 9, wherein the frequency setting unit is arranged to carry out the frequency setting on the highest side channel signal of the multichannel signal received by the first section, the highest side channel signal of the multichannel signal being transmitted from an opponent wireless communication apparatus having a channel unit in which a transmitting I-channel signal and a transmitting Q-channel signal are exchanged with each other.

19. A wireless communication apparatus according to claim 18, wherein the first section is arranged as a wireless communication apparatus using a millimeter wave band or quasi-millimeter wave band for the wireless communication.

20. A wireless communication apparatus according to claim 9, wherein the first section is arranged as a wireless communication apparatus using a millimeter wave band or quasi-millimeter wave band for the wireless communication.

* * * * *